(12) United States Patent
Araki et al.

(10) Patent No.: US 6,639,763 B1
(45) Date of Patent: Oct. 28, 2003

(54) MAGNETIC TRANSDUCER AND THIN FILM MAGNETIC HEAD

(75) Inventors: Satoru Araki, Tokyo (JP); Masashi Sano, Tokyo (JP); Yoshihiro Tsuchiya, Tokyo (JP)

(73) Assignee: TDK Corporation, Tokyo (JP)

( * ) Notice: Subject to any disclaimer, the term of this patent is extended or adjusted under 35 U.S.C. 154(b) by 239 days.

(21) Appl. No.: 09/663,387

(22) Filed: Sep. 15, 2000

Related U.S. Application Data

(60) Provisional application No. 60/189,467, filed on Mar. 15, 2000.

(51) Int. Cl.[7] .................................................. G11B 5/39
(52) U.S. Cl. ..................................................... 360/324
(58) Field of Search .................. 360/324, 324.1–324.12; 365/158, 171, 173; 428/692, 693; 338/32 R; 324/207.21, 252

(56) References Cited

U.S. PATENT DOCUMENTS

| | | | |
|---|---|---|---|
| 5,341,118 A | | 8/1994 | Parkin et al. |
| 5,447,781 A | * | 9/1995 | Kano et al. .................. 428/212 |
| 5,523,172 A | * | 6/1996 | Saito et al. .................. 428/611 |
| 5,534,355 A | * | 7/1996 | Okuno et al. ................ 324/252 |
| 5,648,885 A | * | 7/1997 | Nishioka et al. ............ 324/252 |
| 5,658,658 A | * | 8/1997 | Yamamoto .................. 427/127 |
| 5,901,018 A | | 5/1999 | Fontana, Jr. et al. |
| 6,002,553 A | * | 12/1999 | Stearns et al. .............. 360/324 |
| 6,104,632 A | * | 8/2000 | Nishimura .................. 365/158 |
| 6,208,491 B1 | * | 3/2001 | Pinarbasi ................. 360/324.1 |
| 6,226,159 B1 | * | 5/2001 | Pinarbasi ................. 360/324.11 |
| 6,268,985 B1 | * | 7/2001 | Pinarbasi ................. 360/324.12 |
| 6,271,997 B1 | * | 8/2001 | Gill ............................. 360/314 |
| 6,407,890 B1 | * | 6/2002 | Gill ............................. 360/314 |
| 2001/0030842 A1 | * | 10/2001 | Pinarbasi ............... 360/324.11 |

FOREIGN PATENT DOCUMENTS

| | | | | |
|---|---|---|---|---|
| EP | 1085586 A2 | * | 3/2001 | ........... G01R/33/09 |
| GB | 2312088 A | * | 10/1997 | ........... H01L/43/08 |
| JP | 03052111 A | * | 3/1991 | |
| JP | 4-360009 | | 12/1992 | |
| JP | 5-067820 | | 3/1993 | |
| JP | 5-090026 | | 4/1993 | |
| JP | 5-275769 | | 10/1993 | |
| JP | 06200364 A | * | 7/1994 | |
| JP | 06232476 A | * | 8/1994 | |
| JP | 7-078316 | | 3/1995 | |
| JP | 07142251 A | * | 6/1995 | |
| JP | 07221363 A | * | 8/1995 | |
| JP | 09035216 A | * | 2/1997 | |
| JP | 9-129445 | | 5/1997 | |
| JP | 9-180135 | | 7/1997 | |

* cited by examiner

*Primary Examiner*—William Klimowicz
(74) *Attorney, Agent, or Firm*—Oliff & Berridge PLC

(57) ABSTRACT

An object of the invention is to provide a magnetic transducer and a thin film magnetic head having resistance properties adaptable to ultra-high-density recording. An MR element, the magnetic transducer, has a stack including a plurality of magnetic layers stacked alternately with a plurality of nonmagnetic layers. The stack has a first region and a second region into which the stack is divided in the direction of stacking thereof. The first and second regions of the stack differ from each other in the material or composition of the magnetic layers. The MR element has the above-described structure, thereby being capable of obtaining high resistance and a high rate of resistance change.

16 Claims, 13 Drawing Sheets

MAGNETIC TRANSDUCER AND THIN FILM MAGNETIC HEAD

BACKGROUND OF THE INVENTION

1. Field of the Invention

The invention relates to a magnetic transducer and a thin film magnetic head using the same. More particularly, the invention relates to a magnetic transducer capable of obtaining resistance properties adaptable to ultra-high-density recording and a thin film magnetic head using the same.

2. Description of the Related Art

Recently, an improvement in performance of a thin film magnetic head has been sought in accordance with an increase in a surface recording density of a hard disk or the like. A composite thin film magnetic head, which has a stacked structure comprising a reproducing head having a magnetoresistive element (hereinafter referred to as an MR element) that is a type of magnetic transducer and a recording head having an inductive magnetic transducer, is widely used as the thin film magnetic head.

MR elements include an element using a magnetic film (an AMR film) exhibiting an anisotropic magnetoresistive effect (an AMR effect), and an element using a magnetic film (a GMR film) exhibiting a giant magnetoresistive effect (a GMR effect). The GMR film is mainly used in the MR element for the reproducing head whose surface recording density exceeds 3 Gbit/inch$^2$. As the GMR film, a "multilayered type (antiferromagnetic type)" film, an "inductive ferromagnetic type" film, a "granular type" film, a "spin valve type" film and the like are proposed. Of these types of films, the spin valve type GMR film is used for the industrialization of a magnetic head.

The spin valve type GMR film has a stacked structure comprising a nonmagnetic layer; a magnetic layer having the fixed orientation of magnetization; and a magnetic layer having the orientation of magnetization changing in accordance with a signal magnetic field, in which the magnetic layers are stacked with the nonmagnetic layer in between. Electrical resistance changes in accordance with a relative angle between the orientations of magnetizations of the two magnetic layers. The spin valve type GMR film obtains the rate of resistance change of 2% to 6% (U.S. Pat. No. 5,408,377).

Moreover, a "tunnel junction type" GMR film utilizing a tunnel current passing through a thin insulating layer has been recently developed (U.S. Pat. No. 5,901,018). The tunnel junction type GMR film has a structure in which an insulating layer is sandwiched between two magnetic layers. During the passage of the tunnel current through the insulating layer, electrical resistance changes in accordance with the signal magnetic field. The tunnel junction type GMR film obtains higher electrical resistance as a junction area becomes smaller. However, shot noise is caused and thus the S/N (signal to noise) ratio becomes low. Therefore, the tunnel junction type GMR film has the limitations of improvement in properties of the magnetic head.

Therefore, attention has been recently paid to an MR element having the so-called CPP (Current Perpendicular to the Plane) structure in which a current is passed through the multilayered type GMR film in a direction of stacking (Japanese Unexamined Pat. Application Publication No. Hei 5-275769). The multilayered type GMR film has a stack comprising magnetic layers alternating with nonmagnetic layers. The orientations of magnetizations of the magnetic layers change in accordance with the signal magnetic field, and thus electrical resistance changes. The above-mentioned multilayered type GMR film is disclosed in, for example, Japanese Unexamined Pat. Application Publication No. Hei 4-360009, Japanese Patent No. 2610376, Japanese Unexamined Patent Application Publication No. Hei 5-90026, Japanese Unexamined Patent Application Publication No. Hei 7-78316 and Japanese Unexamined Patent Application Publication No. Hei 9-180135. According to the multilayered type GMR film, the rate of resistance change is about 1% to 10% when the current is passed perpendicularly to the direction of stack (Japanese Unexamined Patent Application Publication No. Hei 5-90026). The rate of resistance change is about 10% to 15% when the current is passed in the direction of stack.

However, currently, demand for high-density recording on the hard disk or the like is increasingly growing. Thus, the surface recording density exceeding 100 Gbit/inch$^2$ is required. A size of the MR element must be about 0.1 μm in order to meet the demand for such ultra-high-density recording. A higher rate of resistance change is needed in order to ensure high head output. Consequently, there is a problem that the heretofore-reported rate of resistance change of 10% to 15% of the CPP structure is insufficient.

In order to ensure high head output, it is necessary to increase resistance as well as the rate of resistance change. Although a conventional CPP structure can increase either the rate of resistance change or the resistance by selecting a material for constituting the magnetic layer, the conventional CPP structure has a problem of having difficulty in increasing both the rate of resistance change and the resistance. For example, when the magnetic layer is made of a material containing Ni (nickel) as the main ingredient, the resistance can be increased by adding an additive or the like, but the rate of resistance change decreases. When the magnetic layer is made of a material containing Co (cobalt) as the main ingredient, the rate of resistance change can be increased, but the resistance decreases.

SUMMARY OF THE INVENTION

It is an object of the invention to provide a magnetic transducer and a thin film magnetic head which have resistance properties adaptable to ultra-high-density recording.

A magnetic transducer of the invention comprises a stack having a plurality of magnetic layers alternating with a plurality of nonmagnetic layers. In the magnetic transducer, the stack has a plurality of regions into which the stack is divided in the direction of stacking, and at least two regions of the plurality of regions differ from each other in a material or composition of the magnetic layers.

In the magnetic transducer of the invention, at least two regions of the stack differ from each other in the material or composition of the magnetic layers. Therefore, both the rate of resistance change and resistance increase.

In the magnetic transducer of the invention, it is preferable that the stack has the region including the magnetic layers made of a material containing at least Ni in a group consisting of Ni (nickel), Co (cobalt), Fe (iron), Cr (chromium), Ta (tantalum), Rh (rhodium), Mo (molybdenum), Zr (zirconium) and Nb (niobium). Preferably, the stack has the region including the magnetic layers made of a material containing at least Co in a group consisting of Co, Fe and Ni. Preferably, the stack has a first region including the magnetic layers made of a material containing at least Ni in a group consisting of Ni, Co, Fe, Cr, Ta, Rh, Mo, Zr and Nb, and a second region including the magnetic layers made of a material containing at least Co in a group consisting of Co, Fe and Ni. Preferably, the first region has an end surface exposed to the outside for capturing a signal magnetic field.

Preferably, a thickness of each of the magnetic layers of the first region is from 1 nm to 6 nm inclusive and a thickness of each of the magnetic layers of the second region is from 1 nm to 4 nm inclusive. Preferably, the material or composition of the nonmagnetic layers included in the first region differs from the material or composition of the nonmagnetic layers included in the second region. Preferably, the number of the magnetic layers is from 2 to 20 inclusive. Preferably, at least one of the plurality of nonmagnetic layers is made of a material containing at least one element in a group consisting of Au (gold), Ag (silver), Cu (copper), Ru (ruthenium), Rh, Re (rhenium), Pt (platinum) and W (tungsten). Preferably, at least one of the plurality of nonmagnetic layers is made of a material containing Ni and Cr. More preferably, one of the plurality of nonmagnetic layers, which is located on one outermost side in the direction of stacking, is made of a material containing Ni and Cr.

Preferably, a thickness of the nonmagnetic layer is set so as to maximize antiferromagnetic coupling energy induced between two magnetic layers adjacent to each other with the nonmagnetic layer in between. Preferably, the antiferromagnetic coupling energy induced between two magnetic layers adjacent to each other with the nonmagnetic layer in between is from $0.1 \times 10^{-4}$ J/m$^2$ to $2.0 \times 10^{-4}$ J/m$^2$ inclusive.

A thin film magnetic head of the invention has the above-described magnetic transducer.

Preferably, the thin film magnetic head of the invention further comprises a current path for passing a current through the stack in the direction of stacking of the magnetic layers and the nonmagnetic layers. Preferably, the thin film magnetic head further comprises a pair of shield layers for sandwiching the magnetic transducer therebetween with a pair of gap layers in between, and the gap layers and the shield layers function as the current path.

Other and further objects, features and advantages of the invention will appear more fully from the following description.

DETAILED DESCRIPTION OF THE PREFERRED EMBODIMENTS

First embodiment

Constitution of MR Element and thin Film Magnetic Head

Firstly, the respective structures of an MR element that is a specific example of a magnetic transducer according to a first embodiment of the invention and a thin film magnetic head using the MR element will be described with reference to FIGS. 1 to 11.

Figure 1:
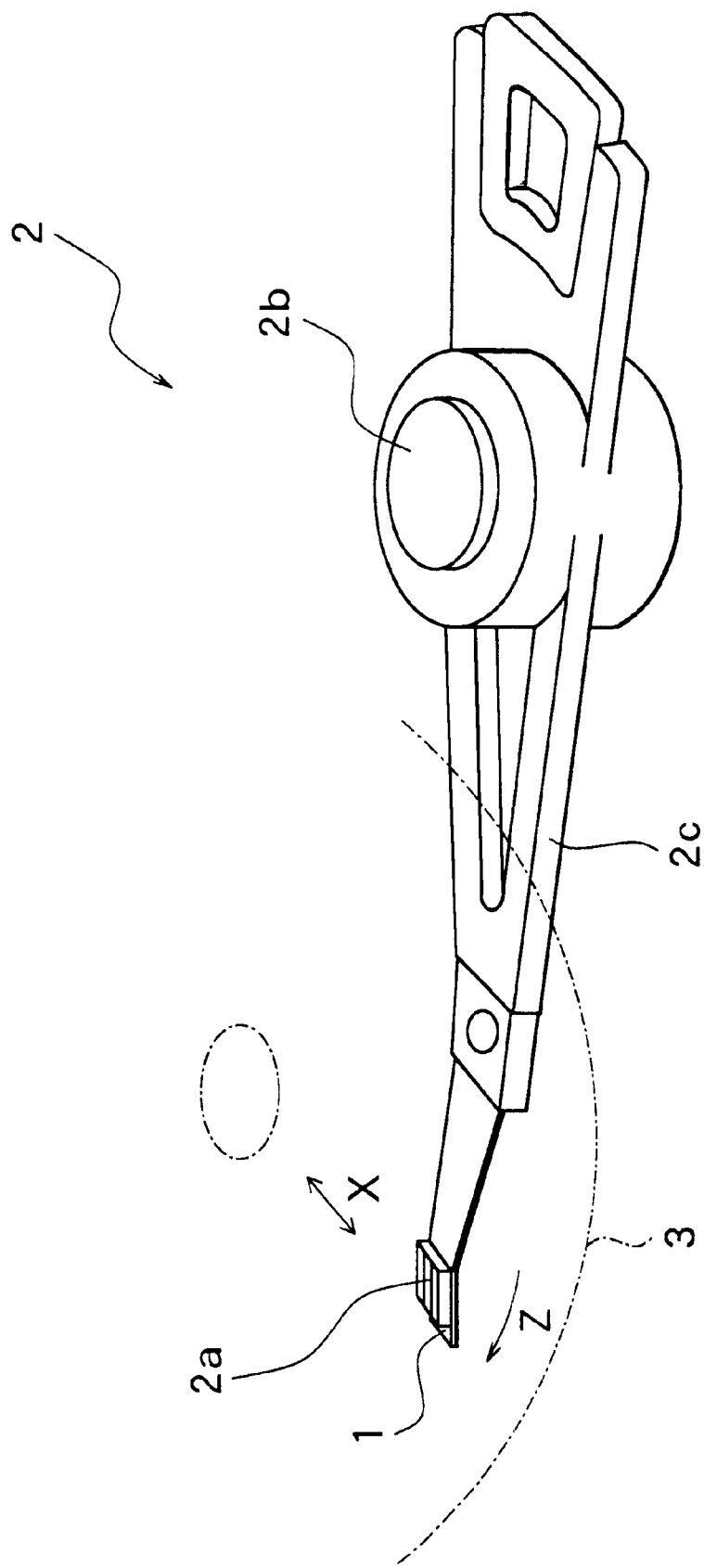
FIG. 1 is a perspective view of a configuration of an actuator arm comprising a thin film magnetic head including a magnetic transducer according to a first embodiment of the invention.

FIG. 1 shows the configuration of an actuator arm 2 comprising a thin film magnetic head 1 according to the embodiment. The actuator arm 2 is used in a hard disk drive (not shown) or the like, for example. The actuator arm 2 has a slider 2a on which the thin film magnetic head 1 is formed. For example, the slider 2a is mounted on the end of an arm 2c rotatably supported by a supporting pivot 2b. The arm 2c is rotated by a driving force of a voice coil motor (not shown), for example. Thus, the slider 2a moves in a direction x in which the slider 2a crosses a track line along a recording surface of a magnetic medium 3 such as a hard disk (a lower surface of the recording surface in FIG. 1). For example, the magnetic medium 3 rotates in a direction z substantially perpendicular to the direction x in which the slider 2a crosses the track line. The magnetic medium 3 rotates and the slider 2a moves in this manner, whereby information is recorded on the magnetic medium 3 or recorded information is read out from the magnetic medium 3.

Figure 2:
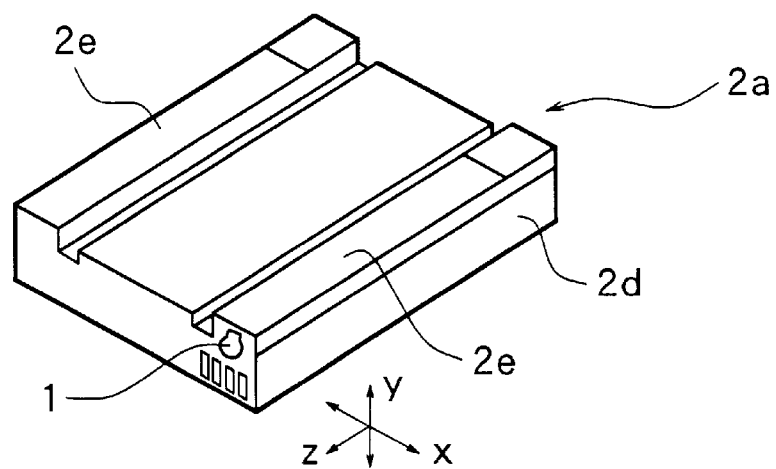
FIG. 2 is a perspective view of a configuration of a slider of the actuator arm shown in FIG. 1.

FIG. 2 shows the configuration of the slider 2a shown in FIG. 1.

The slider 2a has a block-shaped base 2d made of Al$_2$O$_3$–TiC (altic), for example. The base 2d is substantially hexahedral, for instance. One face of the hexahedron closely faces the recording surface of the magnetic medium 3 (see FIG. 1). A surface facing the recording surface of the magnetic medium 3 is called an air bearing surface (ABS)

2e. When the magnetic medium 3 rotates, airflow generated between the recording surface of the magnetic medium 3 and the air bearing surface 2e allows the slider 2a to slightly move away from the recording surface in a direction y opposite to the recording surface. Thus, a constant distance is provided between the air bearing surface 2e and the magnetic medium 3. The thin film magnetic head 1 is formed on one side (the left side in FIG. 2) adjacent to the air bearing surface 2e of the base 2d.

Figure 3:
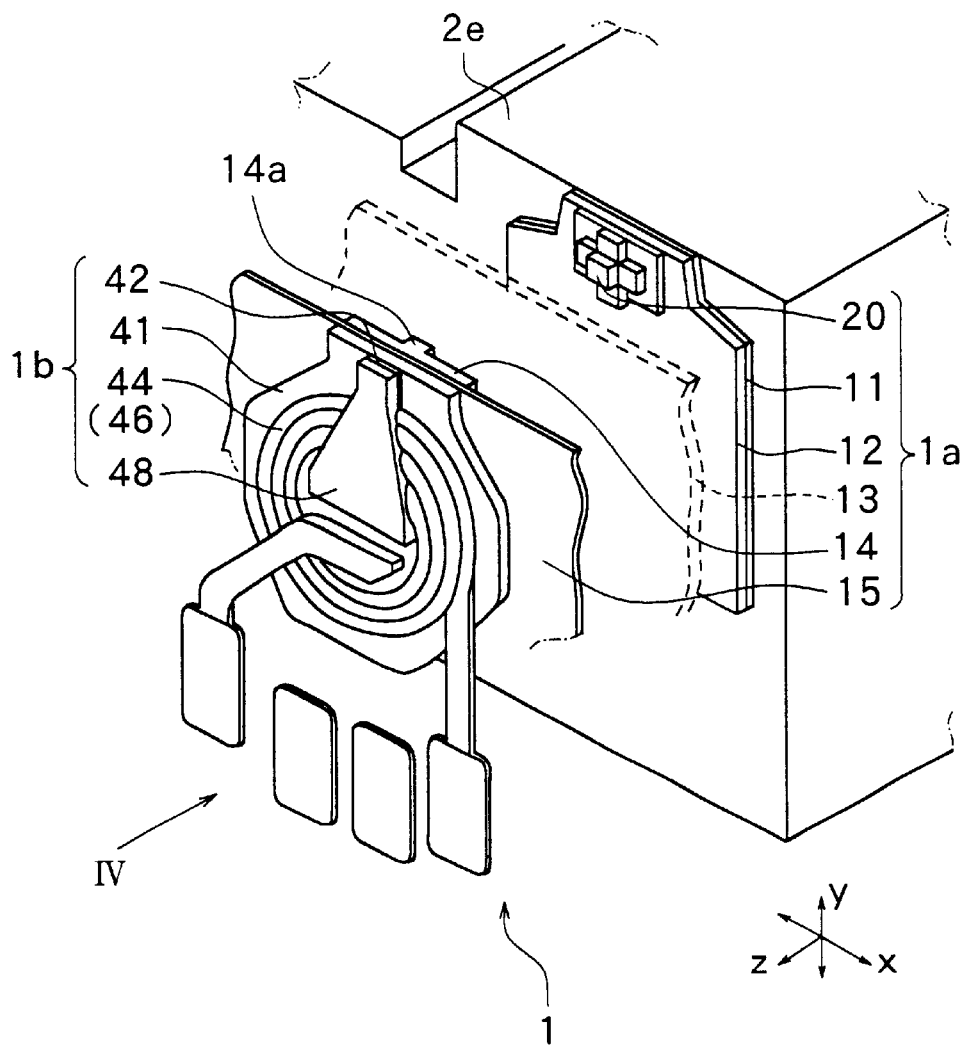
FIG. 3 is an exploded perspective view of a structure of the thin film magnetic head according to the first embodiment.
Figure 4:
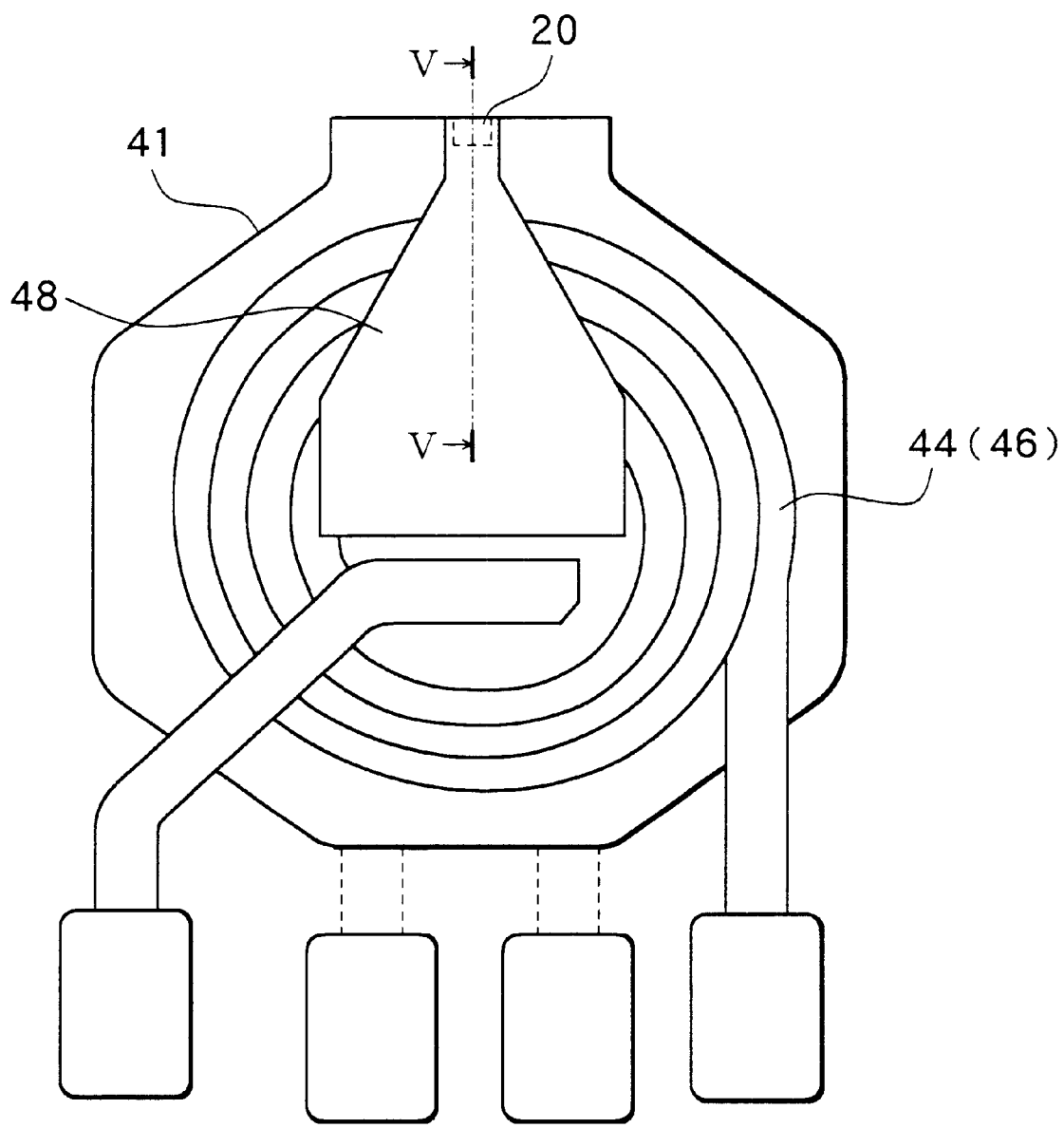
FIG. 4 is a plan view of a structure of the thin film magnetic head shown in FIG. 3 viewed from the direction of the arrow IV of FIG. 3.
Figure 5:
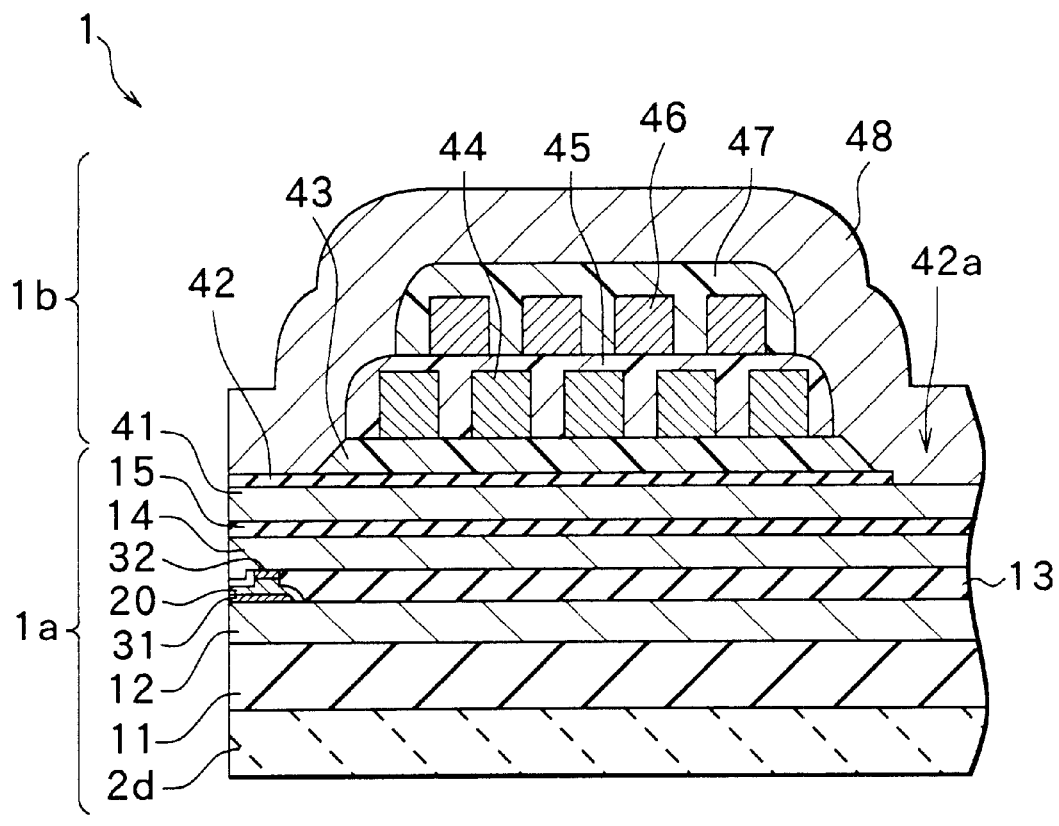
FIG. 5 is a sectional view of a structure of the thin film magnetic head shown in FIG. 3 viewed from the direction of the arrows along the line V—V of FIG. 4.

FIG. 3 is an exploded view of the structure of the thin film magnetic head 1. FIG. 4 shows a plan structure viewed from the direction of the arrow IV of FIG. 3. FIG. 5 shows a sectional structure viewed from the direction of the arrows along the line V—V of FIG. 4. The thin film magnetic head 1 has an integral structure comprising a reproducing head 1a for reproducing magnetic information recorded on the magnetic medium 3 and a recording head 1b for recording magnetic information on the track line of the magnetic medium 3.

As shown in FIGS. 3 and 5, for example, the reproducing head 1a has a stacked structure comprising an insulating layer 11, a first shield layer 12, an insulating layer 13, a second shield layer 14 and an insulating layer 15, which are stacked on the base 2d in this order. For example, the insulating layer 11 is 2 μm to 10 μm in thickness along the direction of stack (hereinafter referred to as a thickness) and is made of $Al_2O_3$ (aluminum oxide). For example, each of the first and second shield layers 12 and 14 is 1 μm to 3 μm in thickness and is made of a magnetic metal material such as NiFe (nickel-iron alloy). The first and second shield layers 12 and 14 are layers for preventing an influence of an unnecessary magnetic field on a stack 20 to be described later. The first and second shield layers 12 and 14 also function as current paths for passing a current through the stack 20 in the direction of stack. For example, each of the insulating layers 13 and 15 is 10 nm to 100 nm in thickness and is made of $Al_2O_3$ or AlN (aluminum nitride). The insulating layer 13 is a layer for providing electrical insulation between the first shield layer 12 and the second shield layer 14. The insulating layer 15 is a layer for providing electrical insulation between the reproducing head 1a and the recording head 1b.

Figure 6:
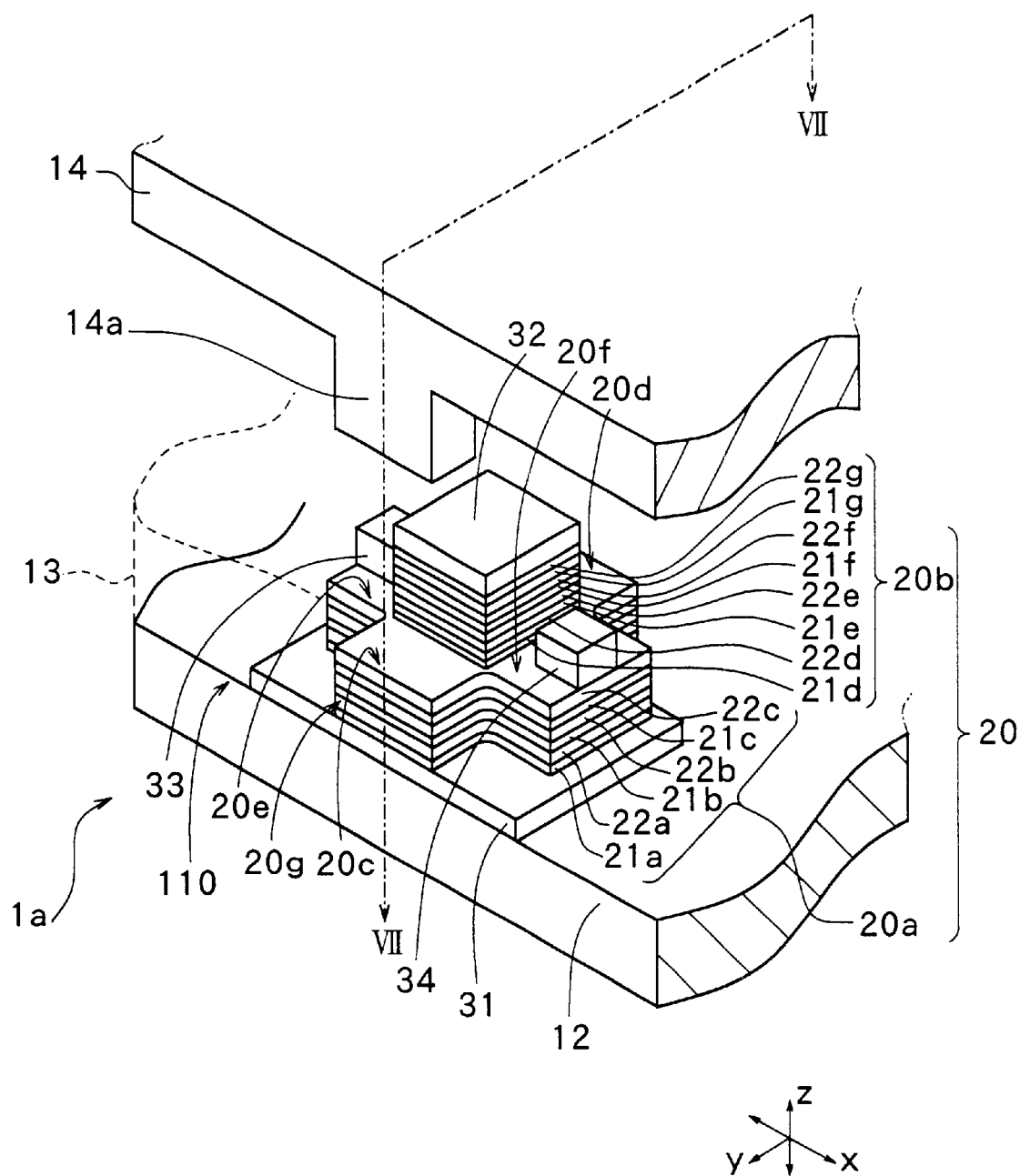
FIG. 6 is a perspective view of a general structure of the magnetic transducer of the thin film magnetic head shown in FIG. 5.
Figure 7:
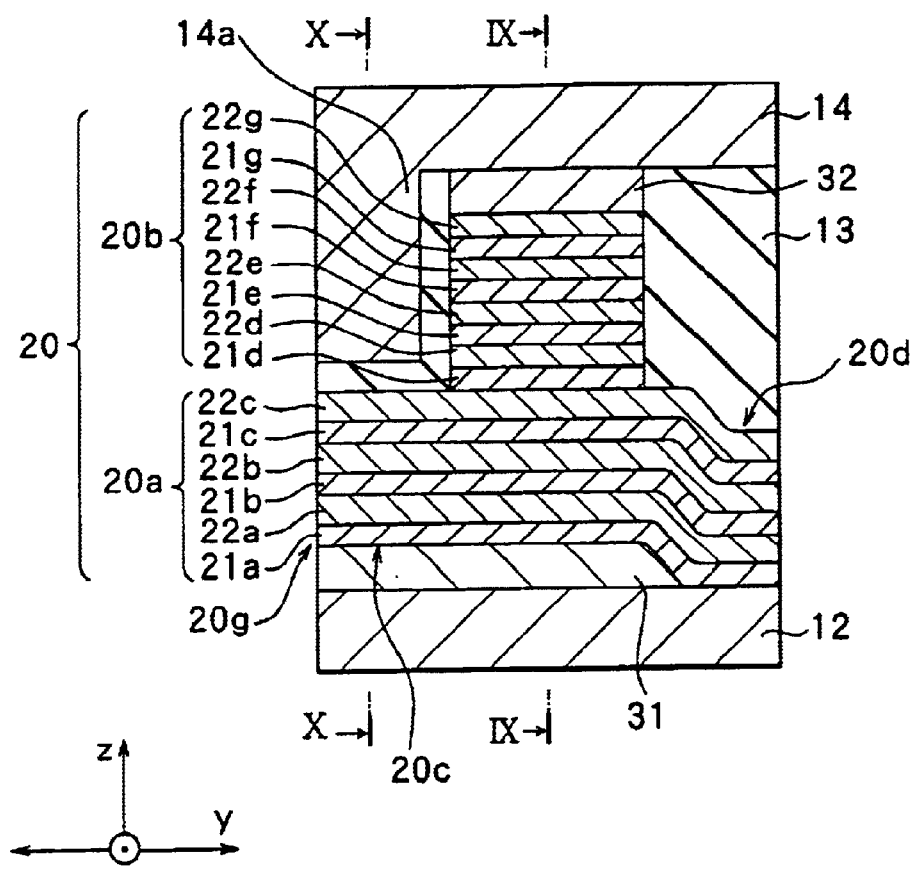
FIG. 7 is a sectional view of a sectional structure of the magnetic transducer shown in FIG. 6 viewed from the direction of the arrows along the line VII—VII of FIG. 6.
Figure 8:
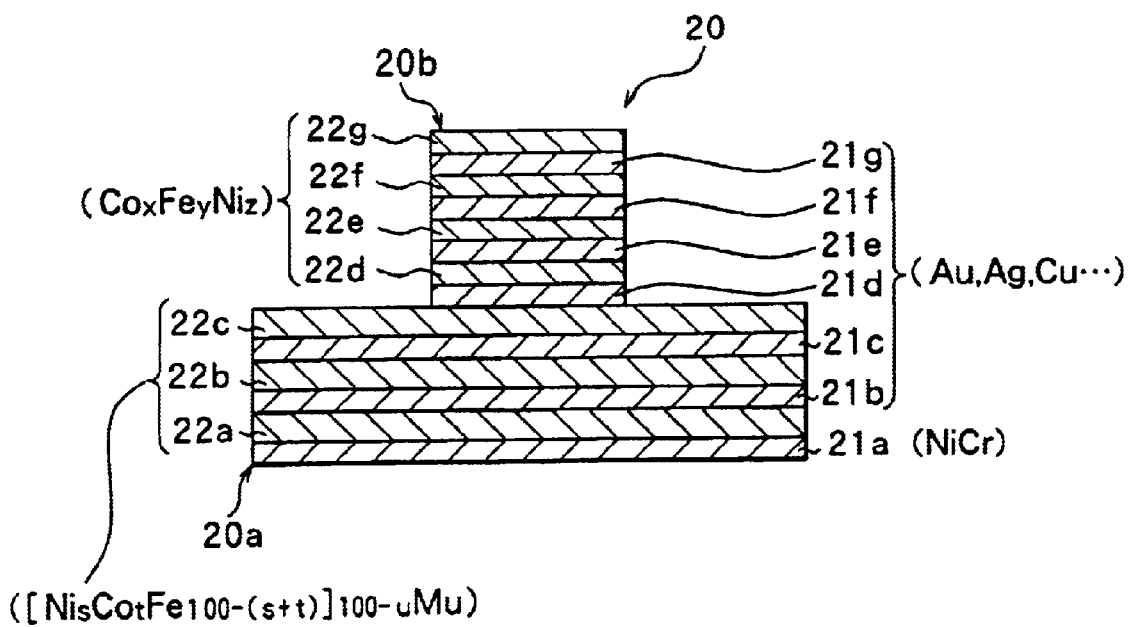
FIG. 8 is a sectional view of a structure of a stack of the magnetic transducer shown in FIG. 6.
Figure 9:
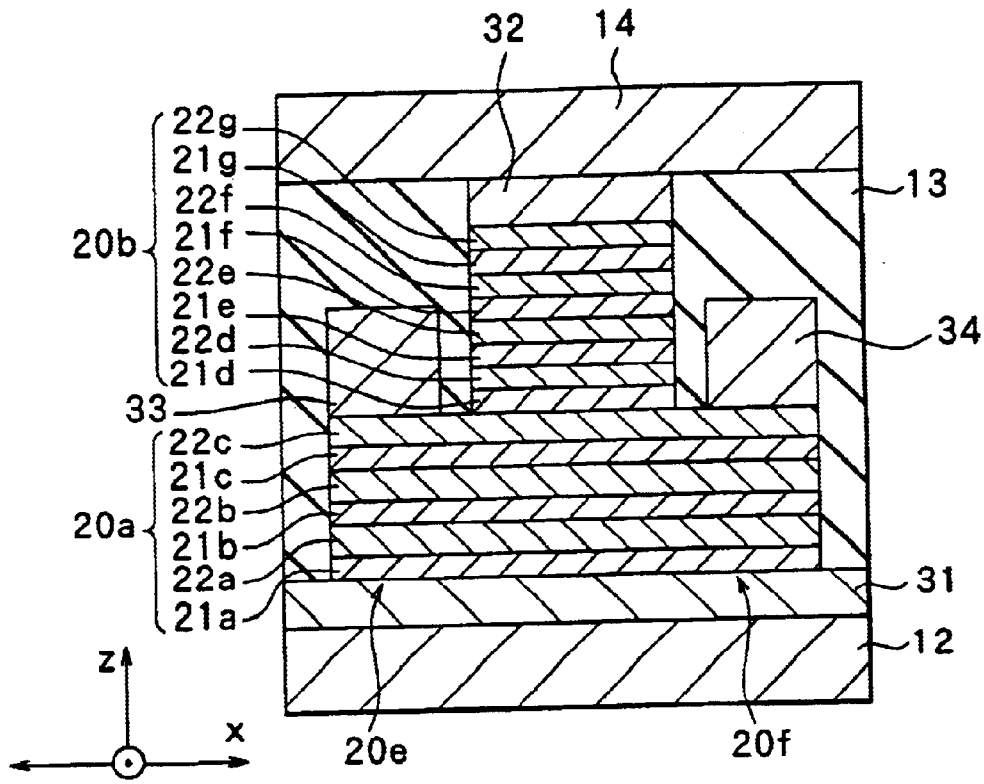
FIG. 9 is a sectional view of a sectional structure of the magnetic transducer shown in FIG. 7 viewed from the direction of the arrows along the line IX—IX of FIG. 7.
Figure 10:
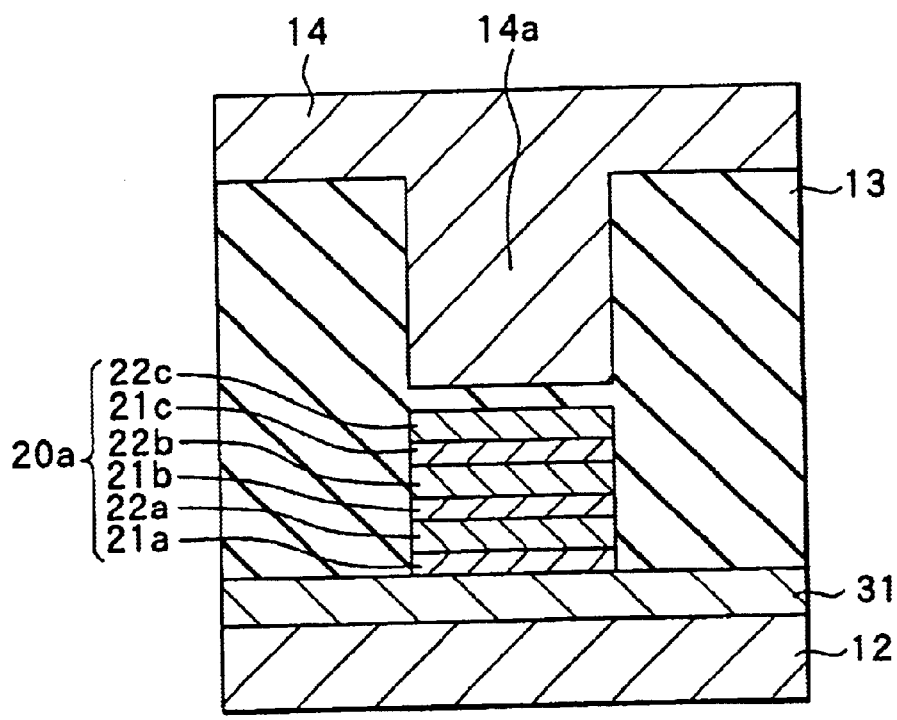
FIG. 10 is a sectional view of a sectional structure of the magnetic transducer shown in FIG. 7 viewed from the direction of the arrows along the line X—X of FIG. 7.

FIG. 6 is a schematic exploded view of the structure of the reproducing head 1a of the thin film magnetic head 1 shown in FIG. 3 FIG. 7 shows a sectional structure taken along the line VII—VII of FIG. 6. FIG. 8 shows only the stack of the thin film magnetic head shown in FIG. 7. FIG. 9 shows a sectional structure viewed from the direction of the arrows along the line IX—IX of FIG. 7. FIG. 10 shows a sectional structure viewed from the direction of the arrows along the line X—X of FIG. 7. An MR element 110 including the stack 20 that is a multilayered type GMR film is formed between the first and second shield layers 12 and 14 on a side close to the air bearing surface 2e with first and second gap layers 31 and 32 in between. For example, each of the first and second gap layers 31 and 32 is 2 nm to 30 nm in thickness and is made of a nonmagnetic metal material containing at least one element in a group consisting of Ta, W, Ru, Pt, Re, Rh, Cr, Al, Cu, Au and Ag. The first and second gap layers 31 and 32 are layers for shielding magnetic coupling between the stack 20 and the first and second shield layers 12 and 14. Similarly to the first and second shield layers 12 and 14, the first and second gap layers 31 and 32 also function as the current paths for passing a current through the stack 20 in the direction of stack.

As shown in FIG. 7, the stack 20 has a stacked structure comprising seven nonmagnetic layers 21a, 21b, 21c, 21d, 21e, 21f and 21g and seven magnetic layers 22a, 22b, 22c, 22d, 22e, 22f and 22g, in which the nonmagnetic and magnetic layers alternate with each other in the direction in which the first and second gap layers 31 and 32 face each other.

In the stack 20, the orientations of magnetizations of the magnetic layers 22a to 22g are substantially fixed by antiferromagnetic coupling between two adjacent ones of the magnetic layers 22a to 22g adjacent to each other with each of the nonmagnetic layers 21b to 21g in between. Preferably, antiferromagnetic coupling energy generated between two adjacent ones of the magnetic layers 22a to 22g is $0.1 \times 10^{-4}$ $J/m^2$ to $2.0 \times 10^{-4}$ $J/m^2$, for example. Too weak antiferromagnetic coupling causes a low rate of resistance change. Too strong antiferromagnetic coupling causes little change in the orientation of magnetization under a signal magnetic field and thus results in low sensitivity. Under no signal magnetic field, an angle between the orientations of magnetizations of two adjacent ones of the magnetic layers 22a to 22g is preferably 90 deg or more, or more preferably from 100 deg to 260 deg inclusive.

Of the layers of the stack 20, the nonmagnetic layer 21a located closest to the first gap layer 31 is used as an underlayer on which the magnetic layers 22a to 22g and the other nonmagnetic layers 21b to 21g are to be formed. Hereinafter, the nonmagnetic layer 21a is referred to as an underlayer 21a.

As shown in FIG. 8, the underlayer 21a is made of a material containing Ni and Cr, for example. This can improve smoothness of interfaces between the magnetic layers 22a to 22g and the nonmagnetic layers 21b to 21g and can improve crystallizability of the magnetic layers 22a to 22g. Specifically, it is preferable that the underlayer 21a is made of $(Ni_aCr_{100-a})_bA_{100-b}$, where A denotes any metallic element other than Ni and Cr. Preferably, a and b are $40 \leq a \leq 75$ and $80 \leq b \leq 100$ in units of at %, respectively. a and b are within the above-mentioned ranges, whereby the interfaces between the nonmagnetic layers 21b to 21g and the magnetic layers 22a to 22g can be made smoother. The range of a is more preferably $50 \leq a \leq 70$, or still more preferably $55 \leq a \leq 65$. Preferably, a thickness of the underlayer 21a is 1 nm to 10 nm. The thickness of the underlayer 21a is within the above-mentioned range, whereby thermal stability of the stack 20 improves and the rate of resistance change thereof increases.

As shown in FIGS. 6 to 10, for example, the stack 20 is divided into a first region 20a and a second region 20b in the direction of stacking. For example, the first region 20a comprises six layers (the underlayer 21a, the magnetic layers 22a to 22c and the nonmagnetic layers 21b and 21c) close to the base 2d, while the second region 20b comprises the remaining eight layers (the magnetic layers 22d to 22g and the nonmagnetic layers 21d to 21g).

For example, the first region 20a is substantially cross-shaped on the first shield layer 12. For example, the second region 20b is shaped into a general rectangular parallelepiped on about the center of the first region 20a. The first region 20a has a projecting portion 20c projecting closer to the air bearing surface 2e, i.e., the magnetic medium 3 than the second region 20b; an extending portion 20d extending in the direction opposite to the projecting portion 20c; and a pair of wide portions 20e and 20f widened in the direction perpendicular to the direction in which the extending portion 20d extends.

For example, an end surface 20g of the projecting portion 20c extends to the air bearing surface 2e, is exposed to the outside and faces the magnetic medium 3. Thus, the projecting portion 20c functions as a magnetic field capturing portion for capturing the signal magnetic field of the magnetic medium 3. Preferably, a length of the projecting portion 20c along the projecting direction thereof, i.e., a distance between the end surface 20g and the second region 20b is 0.1 μm or less, for example. If the length is longer than 0.1 μm, the projecting portion 20c has difficulty in capturing the signal magnetic field and thus output decreases.

For example, the extending portion 20d extends longer than the first gap layer 31, and the end thereof is in contact with the first shield layer 12. The length of the underlayer 21a in the extending portion 20d is shorter than those of the other five layers (the magnetic layers 22a to 22c and the nonmagnetic layers 21b and 21c). Thus, the magnetic layer 22a is in contact with the first shield layer 12. That is, the stack 20 is magnetically coupled to the first shield layer 12 by the extending portion 20d, whereby the signal magnetic field can be more easily captured. Preferably, the length of the extending portion 20d along the extending direction thereof is 0.1 μm or less, for example. If the length is longer than 0.1 μm, an effect of facilitating capturing the signal magnetic field decreases. As shown in FIG. 7, a magnetic field capture limiting portion 14a of the second shield layer 14 is provided on the side of the second region 20b facing the air bearing surface 2e with the insulating layer 13 in between. The magnetic field capture limiting portion 14a is formed of an extending and projecting part of the second shield layer 14. The magnetic field capture limiting portion 14a covers the nearly overall surface of the side of the second region 20b facing the air bearing surface 2e, thereby limiting the capture of the signal magnetic field by the side of the second region 20b facing the air bearing surface 2e. That is, the magnetic field capture limiting portion 14a prevents the second region 20b from directly capturing the signal magnetic field of the magnetic medium 3. and thus allows the second region 20b to receive the signal magnetic field captured via the first region 20a. Thus, in the stack 20, the thickness of the first region 20a functioning as the magnetic field capturing portion is reduced, and the thickness of the overall stack 20 is increased. Therefore, the rate of resistance change and the resistance can be increased. The thickness of the first region 20a is 6 nm to 15 nm, for example. The thickness of the second region 20b is 6 nm to 30 nm, for example.

The magnetic field capture limiting portion 14a is made of, for example, a magnetic material such as NiFe similarly to the second shield layer 14. The insulating layer 13 is interposed between the magnetic field capture limiting portion 14a and the projecting portion 20c of the first region 20a. The distance between the magnetic field capture limiting portion 14a and the projecting portion 20c is 0.5 nm to 5 nm, for example. The insulating layer 13 has facilities for not only ensuring electrical insulation between the second shield layer 14 and the stack 20 but also shielding magnetic coupling between the second shield layer 14 and the stack 20.

As shown in FIG. 8, each of the nonmagnetic layers 21b to 21g of the first and second regions 20a and 20b of the stack 20 is made of, for example, a nonmagnetic metal material containing at least one element in a group consisting of Au, Ag, Cu, Ru, Rh, Re, Pt and W, and the percentage of content of the at least one element is 60 at % or more. Preferably, the thickness of each of the nonmagnetic layers 21b to 21g is set so as to maximize the antiferromagnetic coupling energy induced between two adjacent ones of the magnetic layers 22a to 22g adjacent to each other with each of the nonmagnetic layers 21b to 21g in between. The antiferromagnetic coupling energy is maximized, whereby the angle between the orientations of magnetizations of two adjacent ones of the magnetic layers 22a to 22g can be about 180 deg and the rate of resistance change can be increased.

Figure 11:
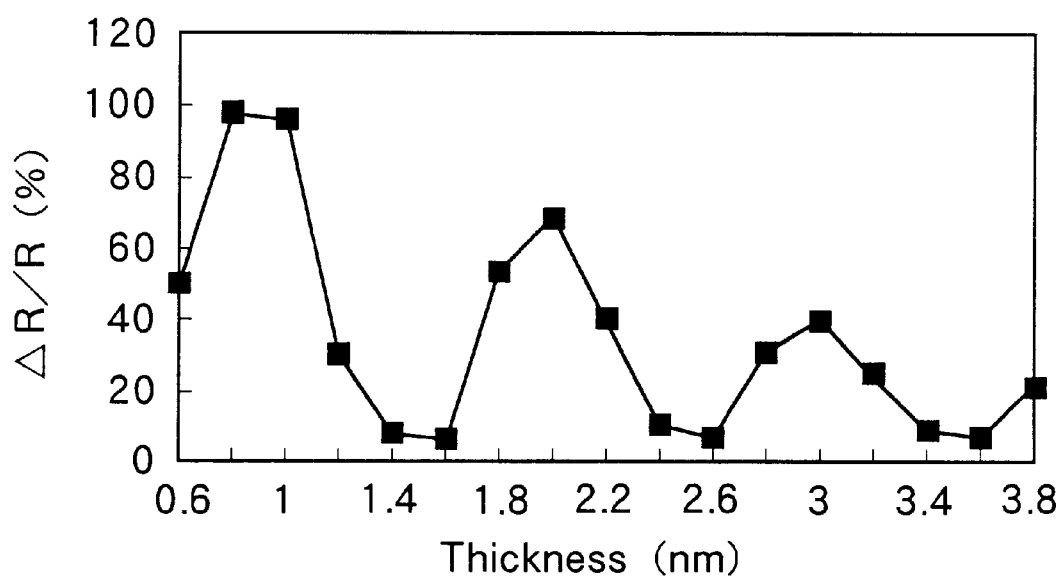
FIG. 11 is a plot of the correlation between the thickness of a nonmagnetic layer and the rate of resistance change.

FIG. 11 shows the correlation between the thickness of each of the nonmagnetic layers 21b to 21g and the rate ΔR/R of resistance change of the stack 20. FIG. 11 shows properties generally called RKKY (Ruderman-Kittel-Kasuya-Yoshida) interaction. FIG. 11 shows the case where the stack has a structure in which the number of magnetic layers is 20, each nonmagnetic layer is made of Cu, each magnetic layer is made of $Co_{80}Fe_{15}Ni_5$ and the thickness of the nonmagnetic layer is changed by every 0.2 nm within a range of from 0.6 nm to 3.8 nm. As shown in FIG. 11, the rate of resistance change takes on some peak values in accordance with the thickness of the nonmagnetic layer. The correlation between the rate of resistance change and the thickness of the nonmagnetic layer corresponds to the correlation between the antiferromagnetic coupling energy induced between two adjacent magnetic layers and the thickness of the nonmagnetic layer. That is, when the rate of resistance change takes on the peak value, the angle between the orientations of magnetizations of two adjacent magnetic layers is about 180 deg and the antiferromagnetic coupling energy also takes on the peak value. In other words, the thickness of each of the nonmagnetic layers 21b to 21g is set so as to maximize the antiferromagnetic coupling energy, whereby the angle between the orientations of magnetizations of two adjacent ones of the magnetic layers 22a to 22g is about 180 deg and the rate of resistance change also increases.

As shown in FIG. 11, the rate of resistance change has a plurality of peak values in accordance with the thickness of each of the nonmagnetic layers 21b to 21g. The thinner the nonmagnetic layers 21b to 21g are, the larger the peak value is. In general, it is preferable that the thickness of each of the nonmagnetic layers 21b to 21g is set so as to correspond to the second largest peak value. If the thickness of each of the nonmagnetic layers 21b to 21g is set so as to correspond to the largest peak value, antiferromagnetic coupling between two adjacent ones of the magnetic layers 22a to 22g is too strong and thus the sensitivity to the signal magnetic field decreases rather than increases. Specifically, it is preferable that the thickness of each of the nonmagnetic layers 21b to is 1 nm to 3 nm.

As shown in FIG. 8, the material or composition of the magnetic layers 22a to 22c of the first region 20a differs from the material or composition of the magnetic layers 22d to 22g of the second region 20b. Preferably, the magnetic layers 22a to 22c of the first region 20a are made of, for example, a material containing at least Ni in a group consisting of Ni, Co, Fe, Cr, Ta, Rh, Mo, Zr and Nb. Specifically, it is preferable that the magnetic layers 22a to 22c are made of $[Ni_sCo_tFe_{100-(s+t)}]_{100-u}M_u$, where M represents at least one of Cr, Ta, Rh, Mo, Zr and Nb, and s, t and u are 75 ≦s ≦90, 0 ≦t≦15 and 0≦u ≦15 in units of at %, respectively. The above-mentioned material is used, whereby the resistance can be increased by an additive element. In addition, the use of the above-mentioned material facilitates change in the orientation of magnetization, and thus the sensitivity to the signal magnetic field improves. Moreover, saturation magnetization decreases, and thus the thickness of each of the magnetic layers 22a to 22c can be increased while keeping the antiferromagnetic coupling energy at a proper value. Therefore, even if the top of the first region 20a is cut away in a manufacturing process, the capture of the magnetic field is not prevented and thus the manufacturing process can be simplified. Furthermore, there is an advantage of improving corrosion resistance. Preferably, the thickness of each of the magnetic layers 22a to 22c of the first region 20a is 1 nm to 6 nm. Thus, the antiferromagnetic coupling energy generated between adjacent ones of the magnetic layers 22a to 22c can take on the proper value. The magnetic layers 22a to 22c of the first region 20a are thickened, whereby the manufacturing process can be simplified as described above, depending on a manufacturing method.

Preferably, the magnetic layers 22d to 22g of the second region 20b are made of, for example, a material containing at least Co in a group consisting of Co, Fe and Ni. Specifically, it is preferable that the magnetic layers 22d to 22g are made of $Co_xFe_yNi_z$, where x, y and z are within a range of $10 \leq x \leq 80$, $0 \leq y \leq 25$ and $0 \leq z \leq 85$ in units of at %, respectively. The use of the above-mentioned material increases the rate of magnetic polarization, and thus a high rate of resistance change can be obtained. Preferably, the thickness of each of the magnetic layers 22d to 22g of the second region 20b is 1 nm to 4 nm. Thus, the antiferromagnetic coupling energy induced between adjacent ones of the magnetic layers 22d to 22g can take on the proper value.

Preferably, each of the magnetic layers 22a to 22g has (111) plane oriented in the direction of stacking. In the embodiment, the underlayer 21a is made of the above-mentioned material, whereby orientation of the (111) plane of each of the magnetic layers 22a to 22g can be improved. Although the number of magnetic layers of the stack 20 is 7 in an example shown in FIGS. 6 to 10, it is preferable that the number of magnetic layers is within a range of from 2 to 20. When the number of magnetic layers is more than 20, the overall stack 20 becomes too thick and thus the orientations of magnetizations of the magnetic layers vary greatly. When the number of magnetic layers is less than 2, the rate of resistance change cannot be sufficiently increased. More preferably, the number of magnetic layers of the first region 20a is from 1 to 10 inclusive, and the number of magnetic layers of the second region 20b is from 1 to 10 inclusive.

As shown in FIG. 9, a pair of magnetic domain control layers 33 and 34 made of, for example, a hard magnetic material (the so-called permanent magnet) is provided between the wide portions 20e and 20f of the first region 20a and the insulating layer 13 with the second region 20b sandwiched between the magnetic domain control layers 33 and 34 in the direction perpendicular to the direction of stacking. The magnetic domain control layers 33 and 34 prevent variation in the orientations of magnetizations of the magnetic layers 22a to 22g and thus prevent so-called Barkhausen noise. For example, CoPt (cobalt-platinum alloy) or CoPtCr (cobalt-platinum-chromium alloy) is used as the hard magnetic material. The magnetic domain control layers 33 and 34 are separated from the second region 20b, and the insulating layer 13 is interposed between the magnetic domain control layers 33 and 34 and the second region 20b. This is because the passage of current through the magnetic domain control layers 33 and 34 reduces the current passing through the stack 20 by the current passing through the magnetic domain control layers 33 and 34 and thus reduces the rate of resistance change. Preferably, the thickness of each of the magnetic domain control layers 33 and 34 is 5 nm to 50 nm, for example.

The magnetic domain control layers 33 and 34 may have a stacked structure comprising a ferromagnetic film and an antiferromagnetic film. In this case, an exchange coupling magnetic field is induced on the interface between the ferromagnetic film and the antiferromagnetic film. Thus, the exchange coupling magnetic field matches the orientations of magnetizations of the magnetic layers 22a to 22g to one another. Preferably, the ferromagnetic film for use in this case is made of, for example, NiFe or a magnetic material made of Ni, Fe and Co. The ferromagnetic film may have a stacked structure comprising an NiFe film and a Co film. The antiferromagnetic film may be made of a heat-treatment type antiferromagnetic material for inducing the exchange coupling magnetic field between a ferromagnetic material and an antiferromagnetic material by heat treatment, or a non-heat-treatment type antiferromagnetic material for inducing the exchange coupling magnetic field between the ferromagnetic material and the antiferromagnetic material even without heat treatment. Non-heat-treatment type antiferromagnetic materials include Mn alloy having γ-phase, and so on. Specifically, RuRhMn (ruthenium-rhodium-manganese alloy), FeMn (iron-manganese alloy), IrMn (iridium-manganese alloy) and the like are included. Heat-treatment type antiferromagnetic materials include Mn alloy having regular crystal structures, and so on. Specifically, PtMn (platinum-manganese alloy), NiMn (nickel-manganese alloy), PtRhMn (platinum-rhodium-manganese alloy) and the like are included.

For example, as shown in FIGS. 3 and 5, the recording head 1b has a bottom pole 41 of 0.5 μm to 3 μm thick made of a magnetic material such as NiFe on the insulating layer 15 of the reproducing head 1a. A write gap layer 42 of 0.05 μm to 0.3 μm thick made of an insulating film such as $Al_2O_3$ is formed on the bottom pole 41. The write gap layer 42 has an opening 42a at the position corresponding to the center of thin film coils 44 and 46 to be described later. An insulating layer 43 made of $Al_2O_3$ or the like and having a thickness of 1.0 μm to 5.0 μm for determining a throat height is formed on the write gap layer 42. The thin film coils 44 of 1 μm to 3 μm thick and a photoresist layer 45 for coating the thin film coils 44 are formed on the insulating layer 43. The thin film coils 46 of 1 μm to 3 μm thick and a photoresist layer 47 for coating the thin film coils 46 are formed on the photoresist layer 45. In the embodiment, the description is given with regard to an example in which two thin film coil layers are stacked. However, the number of thin film coil layers may be one, or three or more.

A top pole 48 of about 3 μm thick made of a magnetic material having high saturation magnetic flux density, such as NiFe or FeN (iron nitride), is formed on the write gap layer 42, the insulating layer 43 and the photoresist layers 45 and 47. The top pole 48 is in contact with and magnetically coupled to the bottom pole 41 through the opening 42a of the write gap layer 42 located at the position corresponding to the center of the thin film coils 44 and 46. Although not shown in FIGS. 3 to 5, an overcoat layer (an overcoat layer 49 shown in FIG. 15) of 20 μm to 30 μm thick made of, for example, $Al_2O_3$ is formed on the top pole 48 so as to coat the overall surface. In the embodiment, a stacked layer structure of the bottom pole 41 to the overcoat layer corresponds to the recording head 1b. The recording head 1b generates a magnetic flux between the bottom pole 41 and the top pole 48 by a current passing through the thin film coils 44 and 46 and magnetizes the magnetic medium 3 by the magnetic flux generated near the write gap layer 42, thereby recording information.

Operation of MR Element and Thin Film Magnetic Head

Next, a reproducing operation of the MR element 110 and the thin film magnetic head 1 having the above-described structures will be described with reference to FIGS. 6 and 7.

In the thin film magnetic head 1, information recorded on the magnetic medium 3 is read out by the reproducing head 1a. In the stack 20 of the reproducing head 1a, the angle between the orientations of magnetizations of two adjacent ones of the magnetic layers 22a to 22g adjacent to each other with each of the nonmagnetic layers 21b to 21g in between is 90 deg or more (e.g., from 100 deg to 260 deg inclusive). Variation in the orientations of magnetizations of the magnetic layers 22a to 22g is prevented by a bias magnetic field generated by the magnetic domain control layers 33 and 34.

For reading out information, a current is passed through the stack 20 in the direction of stacking through the first shield layer 12 and the second shield layer 14. The current passes through the first shield layer 12, the first gap layer 31, the stack 20, the second gap layer 32 and the second shield layer 14 in this order, or the current passes in reverse order.

The magnetic flux of the signal magnetic field of the magnetic medium 3 (see FIG. 1) enters into the first region 20a through the projecting portion 20c. A part of the magnetic flux reaches the second region 20b via the first region 20a. That is, the projecting portion 20c captures the signal magnetic field, and the captured signal magnetic field extends throughout the first region 20a and the second region 20b. The signal magnetic field causes change in the orientations of magnetizations of the magnetic layers 22a to 22g of the first region 20a and the second region 20b. Thus, electrical resistance of the stack 20 changes. The change in electrical resistance is detected as an amount of change in voltage between the first shield layer 12 and the second shield layer 14. Thus, the signal magnetic field of the magnetic medium 3 is detected. In other words, information recorded on the magnetic medium 3 is read out.

The magnetic layers 22a to 22c of the first region 20a are made of a material containing at least Ni in a group consisting of Ni, Co, Fe, Cr, Ta, Rh, Mo, Zr and Nb, and therefore the resistance increases. Furthermore, the magnetic layers 22d to 22g of the second region 20b are made of a material containing at least Co of Co, Ni and Fe, and therefore the rate of resistance change increases. Moreover, the underlayer 21a is made of a material containing Ni and Cr. Thus, the smoothness of the interfaces between the magnetic layers 22a to 22g and the nonmagnetic layers 21b to 21g and the crystallizability of the magnetic layers become good. Therefore, the thermal stability improves, and the rate of resistance change further increases.

Furthermore, the signal magnetic field is captured by the projecting portion 20c of the stack 20. Thus, erroneous detection of adjacent signal magnetic fields is prevented. Moreover, the extending portion 20d of the stack 20 is in contact with the first shield layer 12. Thus, the path for the magnetic flux traveling from the end surface 20g of the stack 20 toward the extending portion 20d thereof is formed. Therefore, the signal magnetic field easily extends throughout the first region 20a and the second region 20b. Accordingly, the rate of resistance change of the stack 20 becomes higher.

Method of Manufacturing MR Element and Thin Film Magnetic Head

Next, a method of manufacturing the MR element 110 and the thin film magnetic head 1 will be briefly described with reference to FIG. 6 and FIGS. 12A–12C through 15. FIGS. 12A–12C through 15 show a sectional structure in the same cross section as a cross section taken along the line VII—VII of FIG. 6.

Figure 12A:
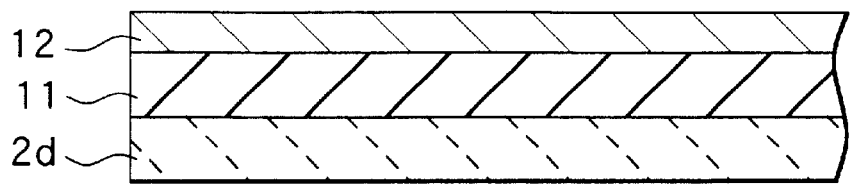
FIGS. 12A to 12C are sectional views for describing a step of a method of manufacturing the thin film magnetic head shown in FIG. 7.
Figure 12B:
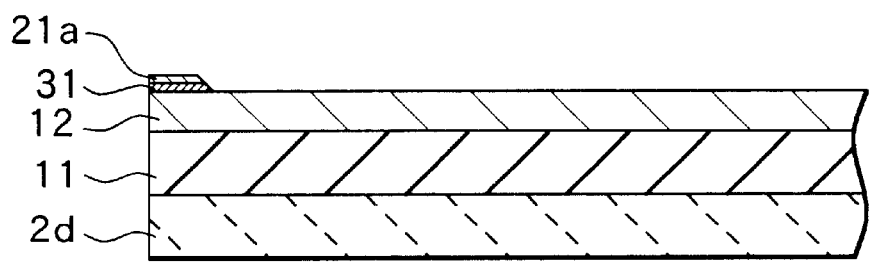

In the method of manufacturing according to the embodiment, first, as shown in FIG. 12A, for example, the insulating layer 11 is formed on one side of the base 2d made of $Al_2O_3$–TiC by sputtering using the material mentioned in the description of the structure. Then, the first shield layer 12 is formed on the insulating layer 11 by, for example, plating using the material mentioned in the description of the structure. Subsequently, as shown in FIG. 12B, the first gap layer 31 and the underlayer 21a are deposited in sequence on the first shield layer 12 by, for example, sputtering using the material mentioned in the description of the structure. Then, the first gap layer 31 and the underlayer 21a are patterned by photolithography using, for example, i-rays, KrF (krypton fluoride) and ArF (argon fluoride).

Figure 12C:
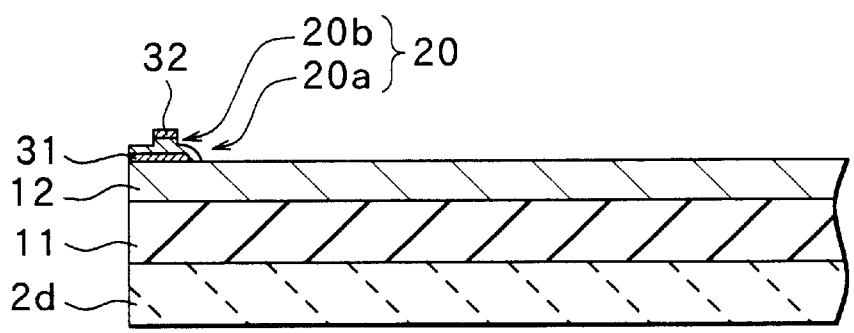

After patterning the first gap layer 31 and the underlayer 21a, as shown in FIG. 12C, the magnetic layers 22a to 22g and the nonmagnetic layers 21b to 21g are alternately deposited on the first gap layer 31 by sputtering, for example. Then, the second gap layer 32 is deposited on the magnetic layer 22g. The respective materials of the magnetic layer, the nonmagnetic layer and the second gap layer 32 are as mentioned in the description of the structure. After that, a resist mask of a predetermined pattern is formed by, for example, electron beam lithography, and milling is performed by, for example, ion milling. The first region 20a, the second region 20b and the second gap layer 32 are formed by controlling a depth of milling. Subsequently, the magnetic domain control layers 33 and 34 are selectively formed on the first region 20a by, for example, sputtering using the material mentioned in the description of the constitution.

Figure 13A:
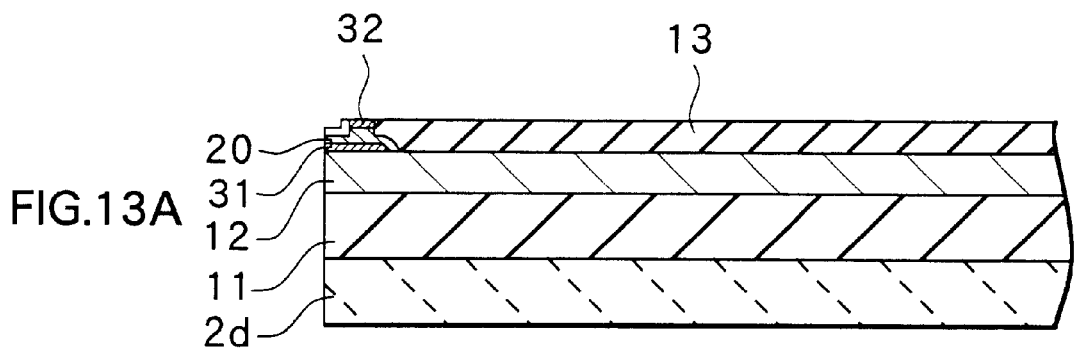
FIGS. 13A and 13B are sectional views for describing a step following the step of FIGS. 12A to 12C.

After forming the magnetic domain control layers 33 and 34, as shown in FIG. 13A, the insulating layer 13 is selectively formed on the first region 20a by, for example, sputtering using the material mentioned in the description of the constitution so as to coat the surface of the first shield layer 12, the stack 20 and the magnetic domain control layers 33 and 34 and to expose the surface of the second gap layer 32.

Figure 13B:
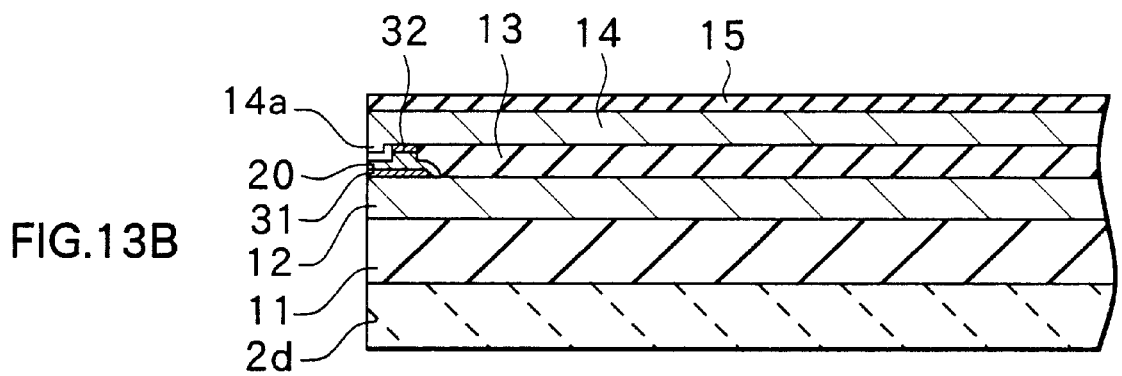
Figure 14A:
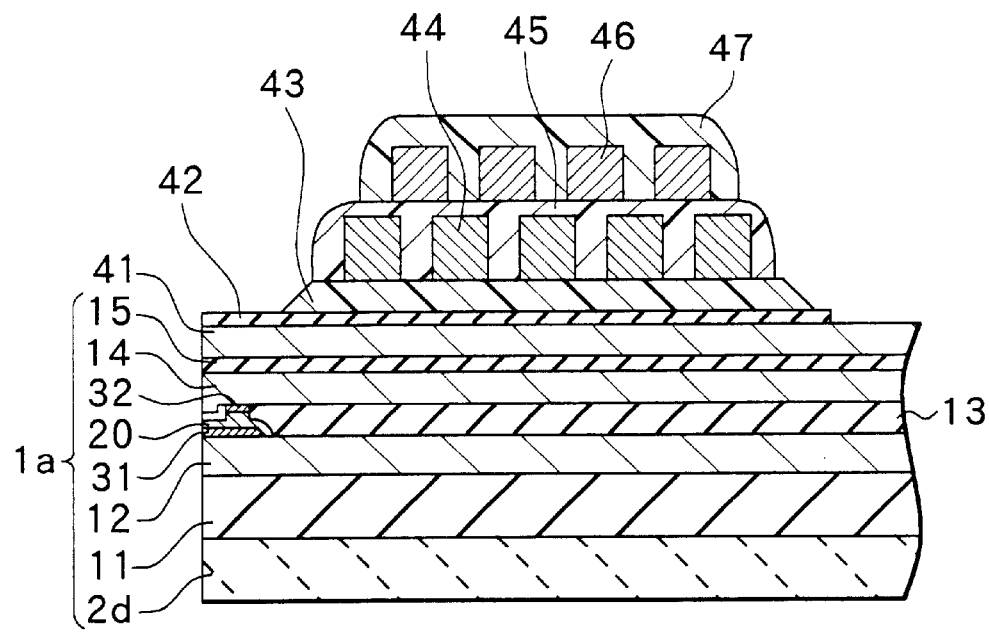
FIGS. 14A and 14B are sectional views for describing a step following the step of FIGS. 13A and 13B.

After forming the insulating layer 13, for example, as shown in FIG. 13B, the second shield layer 14 is deposited on the insulating layer 13 by, for example, sputtering-using the material mentioned in the description of the constitution. At this time, the deposition of the second shield layer 14 fills in a recess naturally formed at the time of forming the insulating layer 13. Thus, the recess filled with the second shield layer 14 is the magnetic field capture limiting portion 14a. After that, the insulating layer 15 is deposited on the second shield layer 14 by, for example, sputtering using the material mentioned in the description of the constitution. After forming the insulating layer 15, as shown in FIG. 14A, the bottom pole 41 is deposited on the insulating layer 15 by, for example, sputtering using the material mentioned in the description of the constitution. Then, the write gap layer 42 is formed on the bottom pole 41 by sputtering, for example. Then, the insulating layer 43 is formed into a predetermined pattern on the write gap layer 42. After forming the insulating layer 43, the thin film coils 44 are formed on the insulating layer 43 by using the material mentioned in the description of the constitution. Then, the photoresist layer 45 is formed into a predetermined pattern so as to coat the thin film coils 44. After forming the photoresist layer 45, the thin film coils 46 are formed on the photoresist layer 45 by using the material mentioned in the description of the constitution. Then, the photoresist layer 47 is formed into a predetermined pattern so as to coat the thin film coils 46.

Figure 14B:
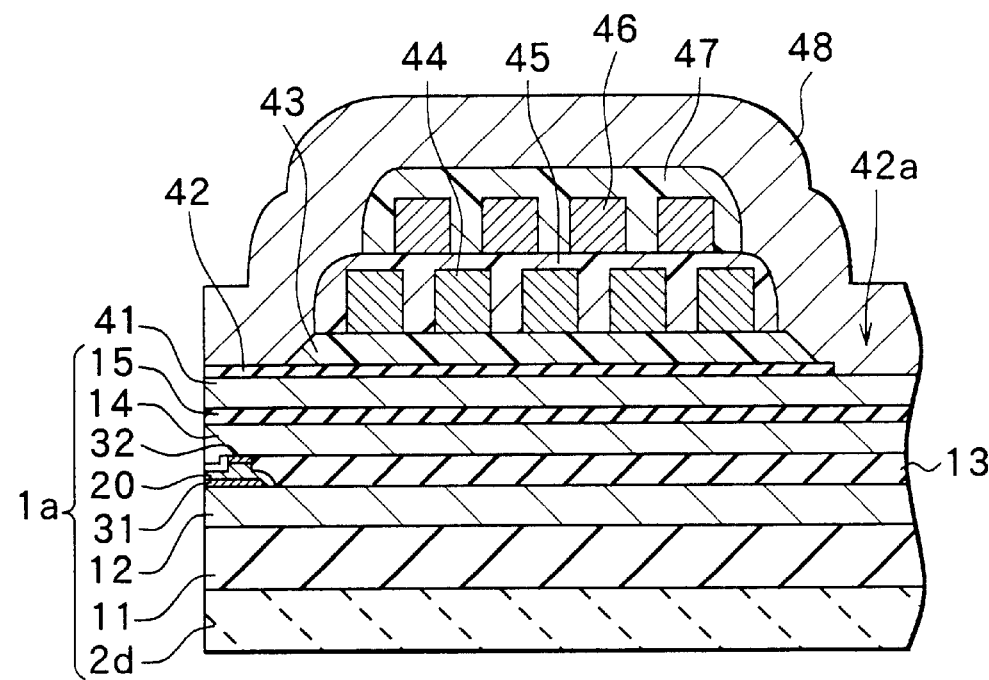
Figure 15:
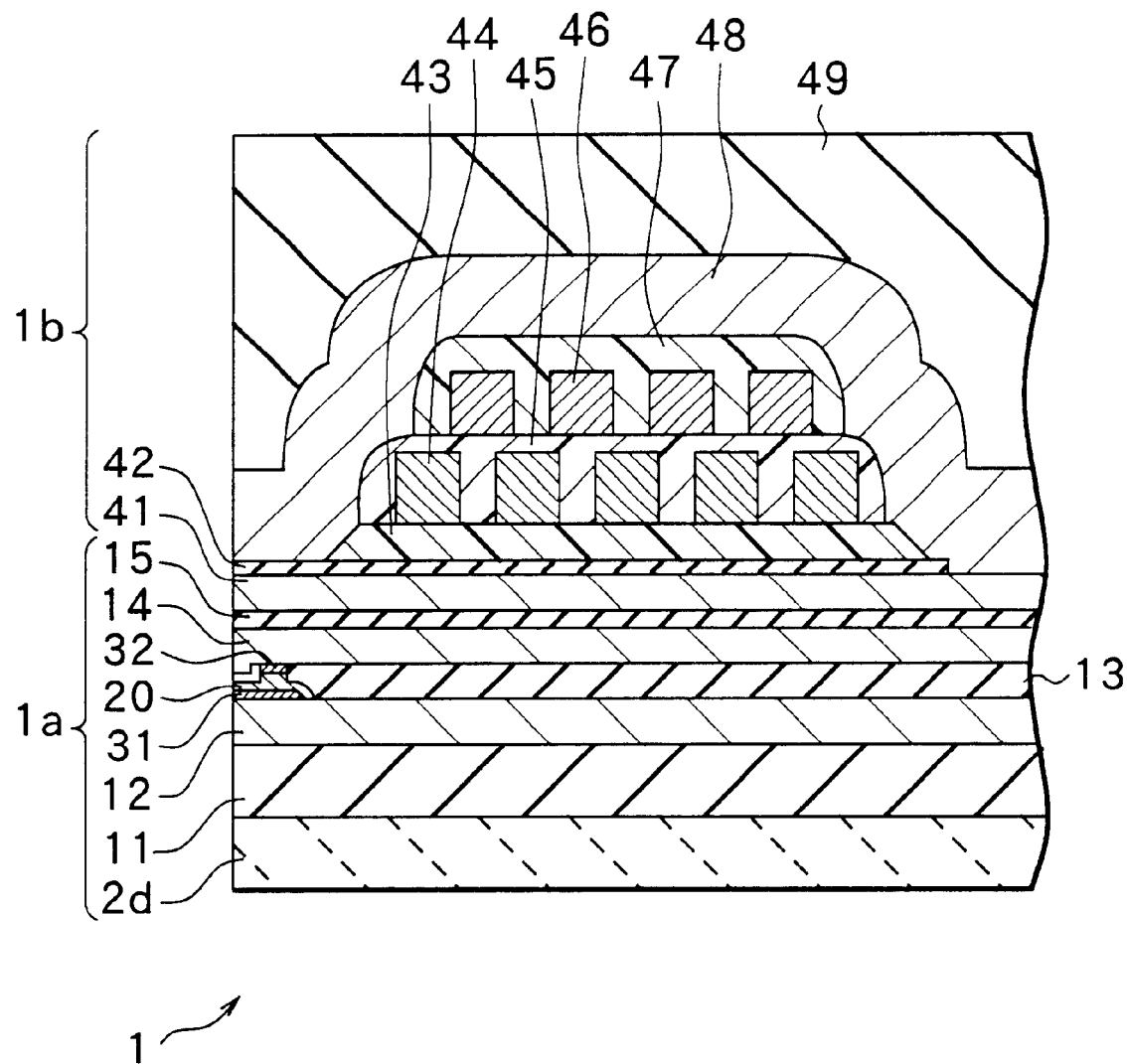
FIG. 15 is a sectional view for describing a step following the step of FIGS. 14A and 14B.

After forming the photoresist layer 47, as shown in FIG. 14B, for example, the write gap layer 42 is partially etched at the position corresponding to the center of the thin film coils 44 and 46, whereby the opening 42a for forming a magnetic path is formed. After that, for example, the top pole 48 is formed on the write gap layer 42, the opening 42a, the insulating layer 43 and the photoresist layers 45 and 47 by using the material mentioned in the description of the constitution. After forming the top pole 48, for example, the write gap layer 42 and the bottom pole 41 are selectively etched by ion milling using the top pole 48 as a mask. After that, as shown in FIG. 15, the overcoat layer 49 is formed on the top pole 48 by using the material mentioned in the description of the constitution. Finally, for example, the air bearing surface is formed by machining the slider 2a. As a result, the thin film magnetic head 1 is completed.

To form the magnetic domain control layers 33 and 34 by using the ferromagnetic film and the antiferromagnetic film instead of a hard magnetic film, heat treatment for inducing exchange coupling between the ferromagnetic film and the antiferromagnetic film takes place when the antiferromagnetic film is made of the heat-treatment type antiferromagnetic material. Specifically, the thin film magnetic head 1 is heated to about 200° C. to 300° C. for 1 hour to 5 hours with the magnetic field applied in a fixed direction by utilizing a magnetic field generating apparatus or the like, for example. Thus, the orientation of magnetization of the ferromagnetic film is fixed in the direction of the applied magnetic field, and therefore the bias magnetic field is generated. On the other hand, when the antiferromagnetic film is made of the non-heat-treatment type antiferromagnetic material, heat treatment is unnecessary as distinct from the heat-treatment type antiferromagnetic material. In this case, the magnetic domain control layers 33 and 34 are deposited with the magnetic field applied in a predetermined direction, whereby the bias magnetic field is generated in the direction of the applied magnetic field.

Effects of First Embodiment

As described above, according to the embodiment, the material or composition of the magnetic layers 22a to 22c of the first region 20a differs from the material or composition of the magnetic layers 22d to 22g of the second region 20b. Therefore, both the resistance and the rate of resistance change can be increased.

More particularly, the magnetic layers 22a to 22c included in the first region 20a are made of a material containing at least Ni in a group consisting of Ni, Co, Fe, Cr, Ta, Rh, Mo, Zr and Nb, whereby the resistance can be increased by the additive element. Additionally, the orientation of magnetization easily changes, and thus the sensitivity to the signal magnetic field improves. Furthermore, the saturation magnetization can be reduced, and thus the magnetic layers 22a to 22c can be thickened. Even if a top surface of the first region 20a is cut away in forming the second region 20b, the capture of the magnetic field is not prevented and therefore the manufacturing process can be simplified. Furthermore, the corrosion resistance can be improved.

Moreover, the magnetic layers 22d to 22g included in the second region 20b are made of a material containing at least Co in a group consisting of Co, Fe and Ni, whereby the rate of resistance change can be increased.

Furthermore, the first region 20a has the projecting portion 20c for functioning as the magnetic field capturing portion, whereby erroneous detection of adjacent signal magnetic fields can be prevented.

Moreover, the underlayer 21a is made of a material containing Ni and Cr, whereby the crystallizability of the magnetic layers 22a to 22g can be improved and the smoothness of the interfaces between the magnetic layers 22a to 22g and the nonmagnetic layers 21b to 21g can be improved. As a result, the rate of resistance change can be further increased, and the thermal stability can be improved. Furthermore, the nonmagnetic layers 21 are made of a material containing at least one element in a group consisting of Au, Ag, Cu, Ru, Rh, Re, Pt and W, whereby the rate of resistance change can be further increased.

Furthermore, the thickness of each of the magnetic layers 22a to 22g is 1 nm to 6 nm, whereby the antiferromagnetic coupling energy can take on the proper value. Moreover, the number of the magnetic layers 22a to 22g of the stack 20 is from 2 to 20 inclusive, whereby the rate of resistance change can be increased and variation in the orientations of magnetizations of the magnetic layers 22a to 22g can be prevented.

Moreover, the thickness of each of the nonmagnetic layers 21b to 21g is set so as to maximize the antiferromagnetic coupling energy induced between two adjacent ones of the magnetic layers 22a to 22g adjacent to each other with each of the nonmagnetic layers 21b to 21g in between, whereby the antiferromagnetic coupling energy increases and hence the rate of resistance change can be increased. Moreover, the antiferromagnetic coupling energy generated between two adjacent ones of the magnetic layers 22a to 22g is within a range of from $0.1 \times 10^{-4}$ J/m$^2$ to $2.0 \times 10^{-4}$ J/m$^2$, whereby the rate of resistance change can be increased without reducing the sensitivity.

Second Embodiment

Figure 16:
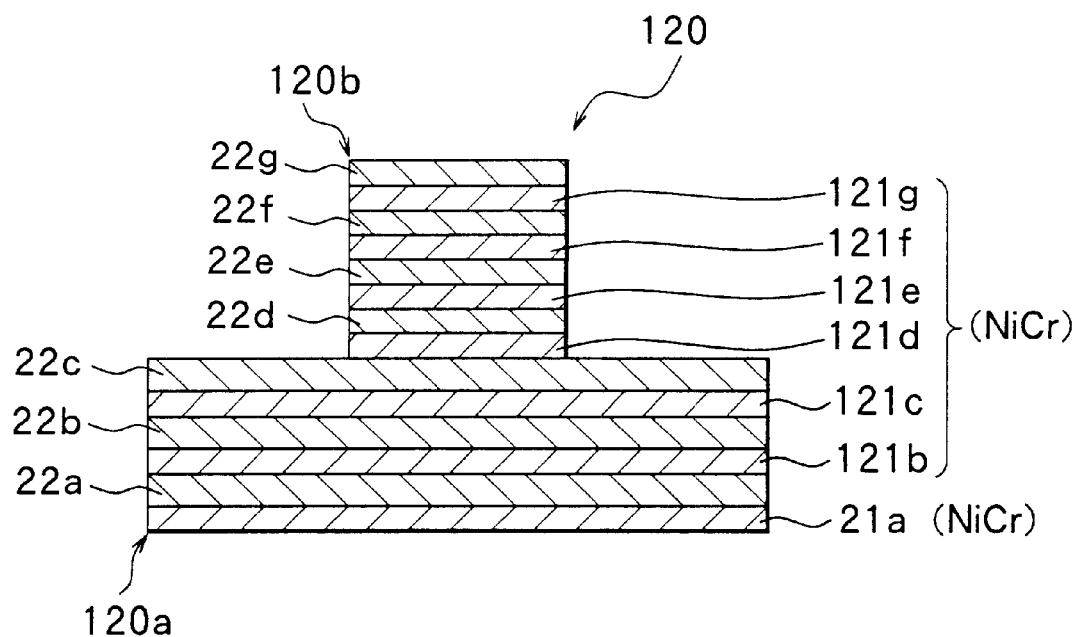
FIG. 16 is a sectional view of a general structure of a magnetic transducer of a thin film magnetic head according to a second embodiment.

Next, a second embodiment of the invention will be described with reference to FIG. 16. A thin film magnetic head according to the second embodiment is the same as the thin film magnetic head according to the first embodiment except that nonmagnetic layers 121b to 121g of a stack 120 are made of other materials. Accordingly, only the stack 120 is shown in FIG. 16.

In the stack 120 of the embodiment, the nonmagnetic layers 121b to 121g included in a first region 120a and a second region 120b contain Ni and Cr, similarly to the underlayer 21a. Specifically, the nonmagnetic layers 121b to 121g are made of $(Ni_aCr_{100-a})_bA_{100-b}$, where A, a and b are as described above. The composition of each of the nonmagnetic layers 121b to 121g may be identical with or different from the composition of the underlayer 21a.

According to the embodiment, the nonmagnetic layers 121b to 121g contain Ni and Cr. Thus, the crystallizability of the magnetic layers 22a to 22g further improves, and the smoothness of the interfaces between the magnetic layers and the nonmagnetic layers further improves. As a consequence, the thermal stability further improves.

Third Embodiment

Figure 17:
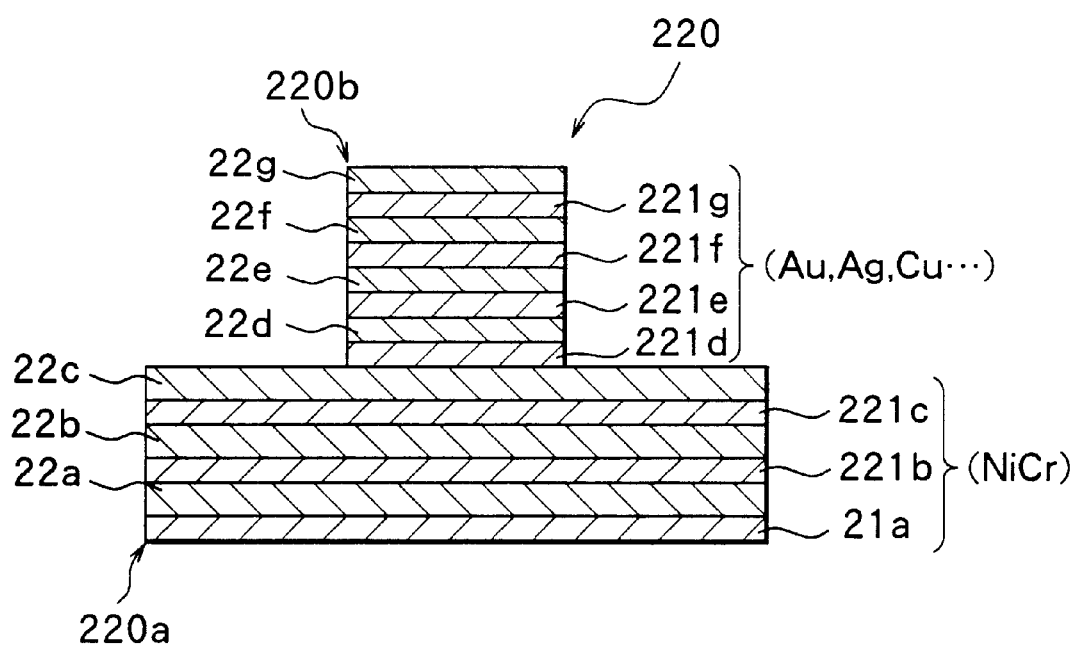
FIG. 17 is a sectional view of a general structure of a magnetic transducer of a thin film magnetic head according to a third embodiment.

Next, a third embodiment of the invention will be described with reference to FIG. 17. A thin film magnetic head according to the third embodiment is the same as the thin film magnetic head according to the first embodiment except that the material or composition of nonmagnetic layers 221b and 221c included in a first region 220a of a stack 220 differs from the material or composition of nonmagnetic layers 221d to 2 included in a second region 220b. Accordingly, only the stack 220 is shown in FIG. 17.

In the stack 220 of the embodiment, the nonmagnetic layers 221b and 221c included in the first region 220a contain Ni and Cr, similarly to the underlayer 21a. Specifically, the nonmagnetic layers 221b and 221c are made of $(Ni_aCr_{100-a})_bA_{100-b}$, where A, a and b are as described above. The composition of each of the nonmagnetic layers 221b and 221c may be identical with or different from the composition of the underlayer 21a. On the other hand, the nonmagnetic layers 221d to 221g included in the second region 220b are made of a nonmagnetic metal material containing at least one element in a group consisting of Au, Ag, Cu, Ru, Rh, Re, Pt and W, and the percentage of content of the at least one element is 60 at % or more, for example.

According to the embodiment, the nonmagnetic layers 221b and 221c are made of a material containing Ni and Cr, and the nonmagnetic layers 221d to 221g are made of a material containing at least one of Au, Ag, Cu, Ru, Rh, Re, Pt and W. Therefore, the rate of resistance change can be increased, and the thermal stability can be improved.

EXAMPLES

Specific Examples of the Invention will be Described in Detail

The stacks 20 shown in FIG. 8 were formed as examples 1 to 4. As shown in Tables 1 and 2, the thickness, material and number of the underlayer 21a, the magnetic layers and the nonmagnetic layers were changed. First, on a substrate on which an electrode pattern was formed, each underlayer 21a was deposited with thicknesses shown in Table 1 by using materials shown in Table 1. The electrode pattern had a stacked structure comprising a Cu layer and a pair of Ta layers for sandwiching the Cu layer therebetween. Subsequently, the magnetic layers and the nonmagnetic layers were alternately deposited in sequence on each underlayer 21a with thicknesses shown in Table 1 by sputtering using materials shown in Table 1. The number of magnetic layers is as shown in Table 1. Subsequently, the electrode pattern having the stacked structure comprising the Cu layer and a pair of Ta layers for sandwiching the Cu layer therebetween was formed on each stack 20. The projecting portion 20c, the extending portion 20d and the wide portions 20e and 20f of the first region 20a were not formed. Thus, the stack 20 was shaped into a rectangular parallelepiped having a total area of 0.25 $\mu m^2$. The length of the first region 20a along the direction perpendicular to the direction of stacking and parallel to the air bearing surface 2e (i.e., the length of the first region 20a along the direction of an MR track width) was 0.1 $\mu m$. The length of the first region 20a along the direction perpendicular to the direction of stacking and perpendicular to the air bearing surface 2e (i.e., the length of the first region 20a along the direction of an MR height) was 0.3 $\mu m$. The length of the second region 20b along the direction of the track width was 0.1 $\mu m$. The length of the second region 20b along the direction of the MR height was 0.08 $\mu m$.

Moreover, the stacks 120 shown in FIG. 16 were prepared as examples 5 to 8 in the same manner as the examples 1 to 4. Furthermore, the stacks 220 shown in FIG. 17 were prepared as examples 9 to 12 in the same manner as the examples 1 to 4. Furthermore, the stack 20 was made as an example 13 in the same manner as the example 1 except that the underlayer was made of Ta.

TABLE 1

| | First region | | | | | | |
|---|---|---|---|---|---|---|---|
| | Underlayer | | Magnetic layer | | Nonmagnetic layer | | Number |
| | Material | Thickness (nm) | Material | Thickness (nm) | Material | Thickness (nm) | of of layers |
| Example | | | | | | | |
| 1 | $Ni_{58}Cr_{42}$ | 5 | $Ni_{80}Fe_{11}Cr_9$ | 3.6 | Cu | 1.8 | 5 |
| 2 | $Ni_{60}Cr_{40}$ | 5 | $Ni_{80}Fe_{10}Ta_{10}$ | 3.6 | Cu | 1.9 | 5 |
| 3 | $Ni_{60}Cr_{40}$ | 5 | $Co_5Fe_{13}Ni_{72}Cr_{10}$ | 4 | Cu | 1.8 | 4 |
| 4 | $Ni_{62}Cr_{38}$ | 4 | $Co_5Fe_{13}Ni_{72}Ta_{10}$ | 4 | Cu | 1.9 | 6 |
| 5 | $Ni_{58}Cr_{42}$ | 5 | $Ni_{80}Fe_{11}Cr_9$ | 3.8 | $Ni_{60}Cr_{40}$ | 1.8 | 5 |
| 6 | $Ni_{60}Cr_{40}$ | 5 | $Ni_{80}Fe_{10}Ta_{10}$ | 3.6 | $Ni_{60}Cr_{40}$ | 1.9 | 5 |
| 7 | $Ni_{60}Cr_{40}$ | 5 | $Co_5Fe_{13}Ni_{72}Cr_{10}$ | 4 | $Ni_{60}Cr_{40}$ | 1.8 | 4 |
| 8 | $Ni_{62}Cr_{38}$ | 4 | $Co_5Fe_{13}Ni_{72}Cr_{10}$ | 4 | $Ni_{60}Cr_{40}$ | 1.9 | 6 |
| 9 | $Ni_{58}Cr_{42}$ | 5 | $Ni_{80}Fe_{11}Cr_9$ | 3.8 | $Ni_{60}Cr_{40}$ | 1.8 | 5 |
| 10 | $Ni_{60}Cr_{40}$ | 5 | $Ni_{80}Fe_{10}Ta_{10}$ | 3.6 | $Ni_{60}Cr_{40}$ | 1.9 | 5 |
| 11 | $Ni_{60}Cr_{40}$ | 5 | $Co_5Fe_{13}Ni_{72}Cr_{10}$ | 4 | $Ni_{60}Cr_{40}$ | 1.8 | 4 |
| 12 | $Ni_{62}Cr_{38}$ | 4 | $Co_5Fe_{13}Ni_{72}Ta_{10}$ | 4 | $Ni_{60}Cr_{40}$ | 1.9 | 6 |
| 13 | Ta | 5 | $Ni_{80}Fe_{11}Cr_9$ | 3.8 | Cu | 1.8 | 5 |
| Comparison | | | | | | | |
| 1 | $Ni_{58}Cr_{42}$ | 5 | $Ni_{80}Fe_{11}Cr_9$ | 3.6 | Cu | 1.8 | 5 |
| 2 | $Ni_{58}Cr_{42}$ | 5 | $Co_{80}Fe_{15}Ni_5$ | 3.6 | Cu | 1.8 | 5 |
| 3 | Ta | 5 | $Ni_{80}Fe_{11}Cr_9$ | 3.6 | Cu | 1.8 | 5 |
| 4 | Ta | 5 | $Co_{80}Fe_{15}Ni_5$ | 3.6 | Cu | 1.8 | 5 |

TABLE 2

| | | Second region | | | |
|---|---|---|---|---|---|
| | | Magnetic layer | | Nonmagnetic layer | | Number |
| | | Material | Thickness (nm) | Material | Thickness (nm) | of layers |
| Example | 1 | $Co_{80}Fe_{15}Ni_5$ | 1.8 | Cu | 1.9 | 15 |
| | 2 | $Co_{80}Fe_{15}Ni_5$ | 1.8 | Cu | 1.9 | 15 |
| | 3 | $Co_{80}Fe_{15}Ni_5$ | 2.0 | Cu | 1.8 | 16 |
| | 4 | $Co_{80}Fe_{15}Ni_5$ | 2.0 | Cu | 1.9 | 14 |
| | 5 | $Co_{80}Fe_{15}Ni_5$ | 1.8 | Cu | 1.9 | 15 |
| | 6 | $Co_{80}Fe_{15}Ni_5$ | 1.8 | Cu | 1.9 | 15 |
| | 7 | $Co_{80}Fe_{15}Ni_5$ | 2.0 | Cu | 1.8 | 16 |
| | 8 | $Co_{80}Fe_{15}Ni_5$ | 2.0 | Cu | 1.9 | 14 |
| | 9 | $Co_{80}Fe_{15}Ni_5$ | 1.8 | $Ni_{60}Cr_{40}$ | 1.9 | 15 |
| | 10 | $Co_{80}Fe_{15}Ni_5$ | 1.8 | $Ni_{60}Cr_{40}$ | 1.9 | 15 |
| | 11 | $Co_{80}Fe_{15}Ni_5$ | 2.0 | $Ni_{60}Cr_{40}$ | 1.8 | 16 |
| | 12 | $Co_{80}Fe_{15}Ni_5$ | 2.0 | $Ni_{60}Cr_{40}$ | 1.9 | 14 |
| | 13 | $Co_{80}Fe_{15}Ni_5$ | 1.8 | Cu | 1.9 | 15 |
| Comparison | 1 | $Ni_{80}Fe_{11}Cr_9$ | 1.8 | Cu | 1.9 | 15 |
| | 2 | $Co_{80}Fe_{15}Ni_5$ | 1.8 | Cu | 1.9 | 15 |
| | 3 | $Ni_{80}Fe_{11}Cr_9$ | 1.8 | Cu | 1.9 | 15 |
| | 4 | $Co_{80}Fe_{15}Ni_5$ | 1.8 | Cu | 1.9 | 15 |

While a current was passed in the direction of stacking through each of the stacks 20, 120 and 220 of the examples 1 to 13 formed as described above, an external signal magnetic field was applied to each stack. At this time, the resistance and the rate of resistance change were measured. Moreover, the rate of resistance change was again measured after heat treatment at 130° C. for 100 hours, and the rate of decrease in the rate of resistance change after heat treatment to the rate of resistance change before heat treatment (hereinafter referred to as the rate of heat deterioration) was determined. The results are shown in Table 3. Furthermore, a signal magnetic field was applied to each stack 20, a saturation magnetic field Hs was measured, and antiferromagnetic coupling energy $J_{AF}$ of the magnetic layer was calculated by using the following equation (1). The antiferromagnetic coupling energy is also shown in Table 3.

$$J_{AF} = Hs \times Ms \times t/4 \quad (1)$$

In the equation (1), Ms denotes saturation magnetization of each magnetic material and takes on a value inherent in each material, and t denotes the thickness of the magnetic layer.

TABLE 3

| | | Antiferromagnetic coupling energy ($\times 10^{-4}$ J/m$^2$) | Resistance (mΩ) | Rate of resistance change (%) | Rate of heat deterioration (%) |
|---|---|---|---|---|---|
| Example | 1 | 1.7 | 14 | 60.4 | −6.2 |
| | 2 | 1.5 | 12 | 65.6 | −6.0 |
| | 3 | 1.3 | 10 | 64.8 | −7.1 |
| | 4 | 1.1 | 11 | 64.4 | −7.3 |
| | 5 | 1.4 | 25 | 46.0 | −2.1 |
| | 6 | 1.0 | 28 | 48.0 | −2.3 |
| | 7 | 1.0 | 24 | 52.0 | −2.5 |
| | 8 | 0.8 | 22 | 56.8 | −2.9 |
| | 9 | 1.5 | 15 | 61.6 | −3.6 |
| | 10 | 1.3 | 17 | 56.8 | −3.4 |
| | 11 | 1.1 | 14 | 51.6 | −3.8 |
| | 12 | 0.9 | 13 | 48.0 | −4.0 |
| | 13 | 1.0 | 29 | 29.2 | −20.5 |
| Comparison | 1 | 0.9 | 18 | 16.3 | −35.1 |
| | 2 | 0.8 | 21 | 19.6 | −36.2 |
| | 3 | 0.3 | 46 | 17.6 | −56.5 |
| | 4 | 0.4 | 58 | 13.7 | −53.7 |

The stacks were formed as comparisons 1 and 2 to the examples under the same conditions as the conditions for the example 1 except that the magnetic layers of the first region and the second region were made of $Ni_{80}Fe_{11}Cr_9$ or $Co_{80}Fe_{15}Ni_5$. Furthermore, the stacks were made as comparisons 3 and 4 under the same conditions as the conditions for the example 13 except that the magnetic layers of the first region and the second region were made of $Ni_{80}Fe_{11}Cr_9$ or $Co_{80}Fe_{15}Ni_5$. The resistance, the rate of resistance change, the rate of heat deterioration and the antiferromagnetic coupling energy of the comparisons were examined in the same manner as the examples. The results are also shown in Table 3.

As can be seen from Table 3, when the examples 1 to 12 having the underlayer made of NiCr are compared to the comparisons 1 and 2 having the underlayer made of NiCr, it turns out that the resistance of the examples 1 to 12 was approximately equal to that of the comparisons 1 and 2, but the rate of resistance change of the examples 1 to 12 was 46% or more and was higher than that of the comparisons 1 and 2. The antiferromagnetic coupling energy of the examples 1 to 12 was also equal to or more than that of the comparisons 1 and 2.

When the example 13 having the underlayer made of Ta is compared to the comparisons 3 and 4 having the underlayer made of Ta, it turns out that the resistance of the example 13 was slightly lower than that of the comparisons 3 and 4, but the rate of resistance change of the example 13 was 29.2% and was higher than that of the comparisons. The antiferromagnetic coupling energy of the example 13 was also higher than that of the comparisons 3 and 4.

In other words, it turns out that the stack has the region including the magnetic layers containing Ni and the region including the magnetic layers containing Co, whereby both a high rate of resistance change and high resistance can be obtained.

The rate of heat deterioration of the examples 9 to 12 was lower than that of the examples 1 to 4, and the rate of heat deterioration of the examples 5 to 8 was lower than that of the examples 9 to 12. In other words, it turns out that the thermal stability is improved by forming more nonmagnetic layers containing Ni and Cr. Moreover, the example 13 has the highest rate of heat deterioration. Therefore, it turns out that at least one of the underlayer and nonmagnetic layers contains Ni and Cr, whereby an effect of improving the thermal stability is achieved.

Furthermore, there is a tendency that the rate of resistance change of the examples 9 to 12 is higher than that of the examples 5 to 8 and the rate of resistance change of the examples 1 to 4 is higher than that of the examples 9 to 12. In other words, it turns out that the provision of the nonmagnetic layers containing Au, Ag, Cu or the like can increase the rate of resistance change and that the provision of both the nonmagnetic layers containing Au, Ag, Cu or the like and the nonmagnetic layers containing Ni and Cr can increase the rate of resistance change and improve the thermal stability.

The thin film magnetic heads according to the above-described embodiments were formed by using the examples 1, 8, 11 and 13 of the above-mentioned examples, and properties of the thin film magnetic heads were measured. The results are shown in Table 4. In each of the formed thin film magnetic heads, the width (MR track width) of the end surface 20g of the first regions 20a; 120a and 220a along the direction perpendicular to the direction of stack, the length (MR height) of the second region 20b along the direction perpendicular to the air bearing surface 2e and the length of the projecting portion 20c were set as shown in Table 4. A measured current was set at 5 mA.

higher than that of the example 13. Furthermore, according to the examples 1, 8 and 11, COV was as small as less than 1%. Thus, it turns out that the examples 1, 8 and 11 could obtain more stable output than that of the example 13. In other words, it turns out that at least one of the nonmagnetic layers and underlayer is made of a material containing Ni and Cr, whereby good thermal stability and a stable output waveform can be obtained.

The above-mentioned examples have been specifically described by referring to some examples. However, the

TABLE 4

|  | MR track width ($\mu$m) | MR height ($\mu$m) | Measured current (mA) | Standardized output ($\mu$V/$\mu$m) | COV (%) | Heat test Standardized output after heat test ($\mu$V/$\mu$m) | Rate of heat deterioration (%) |
|---|---|---|---|---|---|---|---|
| Example |  |  |  |  |  |  |  |
| 1 | 0.10 | 0.05 | 5.0 | 4500 | 0.8 | 4100 | −8.9 |
| 8 | 0.10 | 0.05 | 5.0 | 14000 | 0.7 | 13700 | −2.1 |
| 11 | 0.10 | 0.05 | 5.0 | 6800 | 0.5 | 6500 | −4.4 |
| 13 | 0.10 | 0.05 | 5.0 | 2200 | 2.7 | 1600 | −27.3 |
| Comparison |  |  |  |  |  |  |  |
| 1 | 0.10 | 0.05 | 5.0 | 1800 | 2.9 | 1600 | −11.1 |
| 2 | 0.10 | 0.05 | 5.0 | 1900 | 3.1 | 1700 | −10.5 |
| 3 | 0.10 | 0.05 | 5.0 | 1400 | 3.8 | 1000 | −28.6 |
| 4 | 0.10 | 0.05 | 5.0 | 1300 | 4.2 | 700 | −46.1 |

While a current was passed through each stack 20, an external signal magnetic field was applied to each stack 20. In this state, the properties of each thin film magnetic head, i.e., standardized output, an output covariant value (COV) and the rate of heat deterioration obtained through a heat test were determined. The standardized output corresponds to head output in a unit length of the track width. The output covariant value is calculated in the following manner: a standard deviation $\sigma$ (sigma) of variation in head output values obtained at the time of repeating recording and reproducing 100 times is divided by an average of head outputs. The heat test corresponds to heat treatment at 130° C. for 100 hours. The rate of heat deterioration corresponds to the rate of decrease in the standardized output after the heat test to the standardized output before the heat test.

The thin film magnetic heads were prepared in the same manner by using the comparisons 1 to 4, and the properties of the thin film magnetic heads were examined. The results are also shown in Table 4. The MR track width and the MR height of the stack of each of the prepared thin film magnetic heads are as shown in Table 4.

As can be seen from Table 4, the examples 1, 8 and 11 having the underlayer made of NiCr could obtain the higher standardized output and better output covariant value than those of the comparisons 1 and 2. More particularly, the examples 6 and 11 could obtain high standardized output exceeding 5000 $\mu$V/$\mu$M.

When the example 13 having the underlayer made of Ta is compared to the comparisons 3 and 4 having the underlayer made of Ta, it turns out that the standardized output of the example 13 was 2200 $\mu$V/$\mu$m, which was approximately equal to that of the comparison 3 but was higher than that of the comparison 4.

According to the examples 1, 8 and 11, the rate of heat deterioration of the standardized output obtained through 100-hour heat treatment was −2.1% to −8.9%. Thus, it turns out that the thermal stability of the examples 1, 8 and 11 was stacks having other structures have the structure mentioned in the description of the embodiments, thereby being capable of obtaining the same result.

Although the invention has been described above by referring to some embodiments and examples, the invention is not limited to these embodiments and examples and various modifications of the invention are possible. For example, in the third embodiment, the first region differs from the second region in the material or composition of the magnetic layers and the nonmagnetic layers. However, the first region may differ from the second region in the material or composition of only the nonmagnetic layers.

In the above-described embodiments, the stack has the underlayer. However, the stack may have no underlayer. In the above-described embodiments, the underlayer or at least one of the nonmagnetic layers contains Ni and Cu. However, neither of the underlayer and the nonmagnetic layers may contain Ni and Cu. In the above-described embodiments, the stack has a stacked structure starting with the nonmagnetic layer. However, the stack may have a stacked structure starting with the magnetic layer.

In the above-mentioned embodiments, the description has been given with regard to the case in which a magnetic transducer of the invention is used in a composite thin film magnetic head. However, the magnetic transducer of the invention can be used in a thin film magnetic head for reproducing only. Moreover, the recording head and the reproducing head may be stacked in reverse order. In addition, the magnetic transducer of the invention can be applied to, for example, a sensor for sensing a magnetic signal (an accelerometer, etc.), a memory for storing a magnetic signal, or the like, as well as the thin film magnetic head described by referring to the above-mentioned embodiments.

As described above, according to a magnetic transducer or a thin film magnetic head of the invention, the stack has a plurality of regions into which the stack is divided in the direction of stacking, and at least two regions of the plurality of regions differ from each other in the material or composition of the magnetic layers. Therefore, both the rate of resistance change and the resistance can be increased. That is, an effect of being able to obtain resistance properties adaptable to ultra-high-density recording is achieved.

According to a magnetic transducer of an. aspect of the invention, the stack has the region including the magnetic layers made of a material containing at least Ni in a group consisting of Ni, Co, Fe, Cr, Ta, Rh, Mo, Zr and Nb. An effect of being able to improve the resistance in particular is therefore achieved.

According to a magnetic transducer of another aspect of the invention, the stack has the region including the magnetic layers made of a material containing at least Co in a group consisting of Co, Fe and Ni. An effect of being able to increase the rate of resistance change in particular is therefore achieved.

According to a magnetic transducer of still another aspect of the invention, the stack has a first region including the magnetic layers made of a material containing at least Ni in a group consisting of Ni, Co, Fe, Cr, Ta, Rh, Mo, Zr and Nb, and a second region including the magnetic layers made of a material containing at least Co in a group consisting of Co, Fe and Ni. An effect of being able to increase the resistance and the rate of resistance change is therefore achieved.

According to a magnetic transducer of a further aspect of the invention, the thickness of each of the magnetic layers of the first region is from 1 nm to 6 nm inclusive, and the thickness of each of the magnetic layers of the second region is from 1 nm to 4 nm inclusive. An effect of being able to generate appropriate antiferromagnetic coupling is therefore achieved.

According to a magnetic transducer of a further aspect of the invention, the number of the magnetic layers is from 2 to 20 inclusive. An effect of being able to prevent variation in the orientations of magnetizations of the magnetic layers is therefore achieved.

According to a magnetic transducer of a further aspect of the invention, at least one of the nonmagnetic layers is made of a material containing at least one element in a group consisting of Au, Ag, Cu, Ru, Rh, Re, Pt and W. An effect of being able to further increase the rate of resistance change is therefore achieved.

According to a magnetic transducer of a further aspect of the invention, at least one of the nonmagnetic layers is made of a material containing Ni and Cr. Therefore, achieved is an effect of being able to improve the crystallizability of the magnetic layers, to smooth the interfaces between the magnetic layers and the nonmagnetic layers and to improve the thermal stability.

According to a magnetic transducer of a further aspect of the invention, one of a plurality of nonmagnetic layers, which is located on one outermost side in the direction of stacking, is made of a material containing Ni and Cr. Therefore, achieved is an effect of being able to improve the crystallizability of the magnetic layers, to smooth the interfaces between the magnetic layers and the nonmagnetic layers and to improve the thermal stability.

According to a magnetic transducer of a further aspect of the invention, the thickness of each of a plurality of nonmagnetic layers is set so as to maximize antiferromagnetic coupling energy induced between two magnetic layers adjacent to each other with each of the nonmagnetic layers in between. An effect of being able to increase the rate of resistance change without reducing the sensitivity to the signal magnetic field is therefore achieved.

According to a thin film magnetic head of an aspect of the invention, a current is passed in the direction of stacking of the stack. An effect of being able to make the rate of resistance change higher is therefore achieved, as compared to the case in which a current is passed parallel to a stacked layer surface.

According to a thin film magnetic head of another aspect of the invention, a pair of gap layers and a pair of shield layers for sandwiching the magnetic transducer therebetween are used as a current path. Thus, only a small number of structural components are required. Therefore, an effect of reducing manufacturing costs is achieved.

Obviously many modifications and variations of the present invention are possible in the light of the above teachings. It is therefore to be understood that within the scope of the appended claims the invention may be practiced otherwise than as specifically described.

What is claimed is:

1. A magnetic transducer comprising a stack having a plurality of magnetic layers stacked alternatively with a plurality of nonmagnetic layers;
    wherein the stack has a first region and a second region which are divided in the direction of stacking, the first region having a plurality of magnetic layers, and the second region having a plurality of magnetic layers, and at least one of the magnetic layers of the first region differs from the magnetic layers of the second region in material or composition, wherein a side surface of said first region is offset relative to a side surface of said second region in a direction perpendicular to said direction of stacking.

2. A magnetic transducer according to claim 1, wherein a thickness of each of the magnetic layers of the first region is from 1 nm to 6 nm inclusive, and a thickness of each of the magnetic layers of the second region is from 1 nm to 4 nm inclusive.

3. A magnetic transducer according to claim 1, wherein the material or composition of the nonmagnetic layers included in the first region differs from the material or composition of the nonmagnetic layers included in the second region.

4. A magnetic transducer according to claim 1, wherein the number of the magnetic layers of the stack is from 2 to 20 inclusive.

5. A magnetic transducer according to claim 1, wherein at least one of the plurality of nonmagnetic layers is made of a material containing at least one element in a group consisting of gold (Au), silver (Ag), copper (Cu), ruthenium (Ru), rhodium, rehnium (Re), platinum (Pt) and tungsten (W).

6. A magnetic transducer according to claim 1, wherein at least one of the plurality of nonmagnetic layers is made of a material containing nickel and chromium.

7. A magnetic transducer according to claim 1, wherein one of the plurality of nonmagnetic layers, which is located on one outermost side in the direction of stacking, is made of a material containing nickel and chromium.

8. A magnetic transducer according to claim 1, wherein a thickness of each of the plurality of nonmagnetic layers is set so as to maximize antiferromagnetic coupling energy induced between two magnetic layers adjacent to each other with the nonmagnetic layer in between.

9. A magnetic transducer according to claim 1, wherein the antiferromagnetic coupling energy induced between two magnetic layers adjacent to each other with each of the plurality of nonmagnetic layers in between is from $0.1 \times 10^{-4}$ $J/m^2$ to $2.0 \times 10^{-4}$ $J/m^2$ inclusive.

10. A thin film magnetic head having a magnetic transducer according to claim 1.

11. A thin film magnetic head according to claim 10 further comprising a current path for passing a current through the stack in the direction of stack of the magnetic layers and the nonmagnetic layers.

12. A thin film magnetic head according to claim 10 further comprising a pair of shield layers for sandwiching the magnetic transducer therebetween with a pair of gap layers in between, wherein the gap layers and the shield layers function as the current path for passing a current through the stack in the direction of stack of the magnetic layers and the nonmagnetic layers.

13. The magnetic transducer according to claim 1, wherein the plurality of magnetic layers in the first region are made of a material containing at least nickel in a group consisting of nickel, cobalt, iron, chromium, tantalum, rhodium, molybdenum, zirconium and niobium, and the plurality of magnetic layers in the second region are made of a material containing at least cobalt in a group consisting of cobalt, iron and nickel.

14. The magnetic transducer according to claim 1, wherein the first region has a signal magnetic field capturing portion for capturing a signal magnetic field.

15. A magnetic transducer comprising a stack having a plurality of magnetic layers stacked alternately with a plurality of nonmagnetic layers, wherein the stack has a first region and a second region which are divided in the direction of stacking, the first region having a plurality of magnetic layers, and the second region having a plurality of magnetic layers, and at least one of the magnetic layers of the second region differs from the magnetic layers of the first region in material or composition, and a side surface of said first region is offset relative to a side surface of said second region in a direction perpendicular to said direction of stacking.

16. A thin film magnetic head having the magnetic transducer according to claim 15.

* * * * *